(12) United States Patent
Ke et al.

(10) Patent No.: US 10,879,339 B2
(45) Date of Patent: Dec. 29, 2020

(54) DISPLAY PANEL HAVING PAD DISPOSED ON BOTTOM SURFACE OF SUBSTRATE AND MANUFACTURING METHOD THEREOF

(71) Applicant: Au Optronics Corporation, Hsinchu (TW)

(72) Inventors: Tsung-Ying Ke, Tainan (TW); Yung-Chih Chen, Taichung (TW); Keh-Long Hwu, Hsinchu County (TW); Wan-Tsang Wang, Hsinchu (TW); Chun-Hsin Liu, Yunlin County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/538,783

(22) Filed: Aug. 12, 2019

(65) Prior Publication Data

US 2020/0127073 A1 Apr. 23, 2020

(30) Foreign Application Priority Data

Oct. 22, 2018 (TW) .............................. 107137169 A

(51) Int. Cl.
*H01L 29/08* (2006.01)
*H01L 27/32* (2006.01)

(52) U.S. Cl.
CPC .... *H01L 27/3276* (2013.01); *H01L 2227/326* (2013.01)

(58) Field of Classification Search
CPC ........... H01L 27/3276; H01L 2227/326; H01L 27/1259; H01L 27/1262; H01L 27/124; H01L 51/56; H01L 2227/323
USPC .......................................................... 257/40
See application file for complete search history.

(56) References Cited

U.S. PATENT DOCUMENTS

| | | | |
|---|---|---|---|
| 9,222,961 B1 * | 12/2015 | Lin | .................... G01R 1/07314 |
| 9,445,504 B2 | 9/2016 | Kang et al. | |
| 2015/0021081 A1 * | 1/2015 | Mitarai | .................. H05K 1/115 174/260 |
| 2015/0028289 A1 * | 1/2015 | Hekmatshoartabari | ...................... H01L 29/808 257/40 |

(Continued)

*Primary Examiner* — Caleb E Henry
(74) *Attorney, Agent, or Firm* — JCIPRNET

(57) ABSTRACT

A display panel including a first array substrate, a first pad, and a second pad is provided. The first array substrate includes a first substrate, a first active element, a first display element, and a second display element. The first substrate has a top surface and a bottom surface disposed opposite to each other. The first active element is disposed on the top surface of the first substrate. The first display element is disposed on the top surface of the first substrate and is electrically connected to the first active element. The second display element is disposed on the top surface of the first substrate and is disposed separately from the first display element. The first pad and the second pad are disposed on the bottom surface of the first substrate, wherein the first active element is electrically connected to the first pad, each of the first pad and the second pad includes an embedded part and a protruded part, the embedded part is located in the first substrate, and the protruded part is protruded from the bottom surface of the first substrate.

12 Claims, 13 Drawing Sheets

(56) References Cited

U.S. PATENT DOCUMENTS

2018/0078970 A1* 3/2018 Ono .................... B06B 1/0629

* cited by examiner

DISPLAY PANEL HAVING PAD DISPOSED ON BOTTOM SURFACE OF SUBSTRATE AND MANUFACTURING METHOD THEREOF

CROSS REFERENCE TO RELATED APPLICATION

This application claims the priority benefit of Taiwan application serial no. 107137169, filed on Oct. 22, 2018. The entirety of the above-mentioned patent application is hereby incorporated by reference herein and made a part of specification.

BACKGROUND OF THE INVENTION

Field of the Invention

The invention relates to a display panel and a manufacturing method thereof, and more particularly, to a display panel and a manufacturing method with increased process yield.

Description of Related Art

With the development of the technology industry, display devices such as mobile phones, tablet computers, or eBooks have been widely used in daily life in recent years. In addition to display performance such as resolution, contrast, and viewing angle of the display device, the consumer's demand for the aesthetic appearance of the display device is increasing. In general, the frame around the display region is considered to be one of the important factors affecting the aesthetic appearance of the display device. Therefore, how to reduce the width of the frame without affecting the display performance has become an important issue in the field.

SUMMARY OF THE INVENTION

An embodiment of the invention provides a display panel and a manufacturing method thereof that may improve process yield and achieve the object of a narrow frame or no frame.

A display panel of an embodiment of the invention includes a first array substrate, a first pad, and a second pad. The first array substrate includes a first substrate, a first active element, a first display element, and a second display element. The first substrate has a top surface and a bottom surface disposed opposite to each other. The first active element is disposed on the top surface of the first substrate. The first display element is disposed on the top surface of the first substrate and is electrically connected to the first active element. The second display element is disposed on the top surface of the first substrate and is disposed separately from the first display element. The first pad and the second pad are disposed on the bottom surface of the first substrate, wherein the first active element is electrically connected to the first pad, each of the first pad and the second pad includes an embedded part and a protruded part, the embedded part is located in the first substrate, and the protruded part is protruded from the bottom surface of the first substrate.

A manufacturing method of the display panel of an embodiment of the invention includes the following steps. A release layer and a sacrificial layer are formed on a carrier in order. A first patterning process is performed to form a notch in the sacrificial layer. A pad is formed on the release layer, wherein the pad includes an embedded part and a protruded part, the protruded part is filled in the notch, and the embedded part is located on the sacrificial layer and in contact with two ends of the protruded part. An insulating layer is formed on the pad and the sacrificial layer so that the embedded part of the pad is located in the insulating layer. An active element and a display element are formed on the insulating layer, wherein the active element is electrically connected to the display element, and the active element is electrically connected to the pad. The release layer is separated from the sacrificial layer to expose the protruded part of the pad. The sacrificial layer is removed to expose the embedded part of the pad to form an array substrate.

Based on the above, in the display panel of the invention, the included pad is disposed on the bottom surface of the substrate of the array substrate, and includes an embedded part located in the substrate of the array substrate and a protruded part protruded from the bottom surface of the substrate of the array substrate. As a result, when the array substrate is bonded to an electronic element via an anisotropic conductive layer, cracking to the substrate of the array substrate around the pad may be avoided when the pad is electrically connected to the electronic element, thereby improving process yield.

In addition, the manufacturing method of the display panel of the invention includes the following steps. A pad is formed on the release layer, wherein the protruded part of the pad is filled in the notch of the sacrificial layer, and the embedded part of the pad is located on the sacrificial layer and in contact with the protruded part. An insulating layer is formed on the pad and the sacrificial layer such that the embedded part of the pad is located in the insulating layer. The release layer is separated from the sacrificial layer to expose the protruded part of the pad. The sacrificial layer is removed to expose the embedded part of the pad and form an array substrate. As a result, when the resulting array substrate is bonded to an electronic element via the anisotropic conductive layer, cracking to the insulating layer around the pad may be avoided when the pad is electrically connected to the electronic element, thereby improving process yield.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the present specification, a range represented by "a numerical value to another numerical value" is a schematic representation for avoiding listing all of the numerical values in the range in the specification. Therefore, the recitation of a specific numerical range covers any numerical value in the numerical range and a smaller numerical range defined by any numerical value in the numerical range, as is the case with the any numerical value and the smaller numerical range stated explicitly in the specification.

"About", "similar", "essentially", or "substantially" used in the present specification include the value and the average value within an acceptable deviation range of a specific value confirmed by those having ordinary skill in the art, and the concerned measurement and a specific quantity (i.e., limitations of the measuring system) of measurement-related errors are taken into consideration. For instance, "about" may represent within one or a plurality of standard deviations of the value, or, for example, within ±30%, ±20%, ±15%, ±10%, or ±5%. Moreover, "about", "similar", "essentially", or "substantially" used in the present specification may include a more acceptable deviation range or standard deviation according to measurement properties, cutting properties, or other properties, and one standard deviation does not need to apply to all of the properties.

In the figures, for clarity, the thicknesses of, for instance, layers, films, panels, and regions are enlarged. It should be understood that, when a layer, film, region, or an element of a substrate is "on" another element or "connected to" another element, the element may be directly on the other element or connected to the other element, or an intermediate element may be present. On the other hand, when an element is "directly on another element" or "directly connected to" another element, an intermediate element is not present. As used in the present specification, "connected to" may refer to a physical and/or electrical connection. Furthermore, "electrically connected" may mean that other elements are present between two elements.

FIG. 1A to FIG. 1H are cross sections of a manufacturing process of a display panel according to an embodiment of the invention.

Figure 1A:
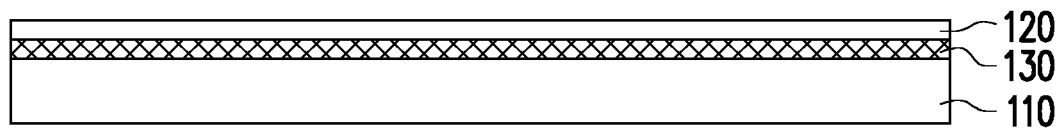
FIG. 1A to FIG. 1H are cross sections of a manufacturing process of a display panel according to an embodiment of the invention.

Referring to FIG. 1A, a release layer 130 and a sacrificial layer 120 are formed on a carrier 110 in order. That is, in the present embodiment, the release layer 130 is located between the carrier 110 and the sacrificial layer 120. From another point of view, in a subsequent process step, the carrier 110 may be separated from the sacrificial layer 120 via the release layer 130. That is, in the present embodiment, the carrier 110 is, for example, a temporary carrier for carrying subsequent element processes. In the present embodiment, the material of the carrier 110 may include glass, quartz, polyester, polycarbonate, or other materials having a certain rigidity. In the present embodiment, the material of the release layer 130 may include a hydrophobic material such as fluorosilane, parylene, metal, or an oxide of the metal, wherein the metal is, for example, titanium (Ti), aluminum (Al), silver (Ag), iron (Fe), nickel (Ni), molybdenum (Mo), or tungsten (W). In the present embodiment, the material of the sacrificial layer 120 may include a metal, an oxide of the metal, or an indium tin oxide (ITO), wherein the metal is, for example, titanium (Ti), aluminum (Al), silver (Ag), iron (Fe), nickel (Ni), molybdenum (Mo), or tungsten (W). In an embodiment, the thickness of the sacrificial layer 120 may be between about 100 Å and about 10,000 Å. In another embodiment, the thickness of the sacrificial layer 120 may be between about 10 Å and about 50,000 Å.

Figure 1B:
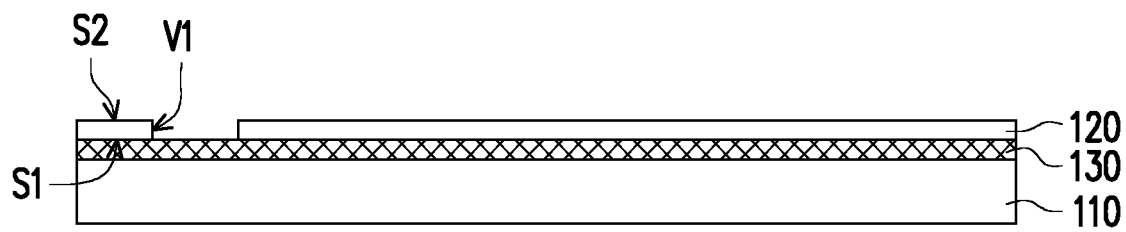

Next, referring to FIG. 1B, the sacrificial layer 120 is patterned to form a notch V1 in the sacrificial layer 120. In the present embodiment, the notch V1 passes through the sacrificial layer 120. In other words, in the present embodiment, the notch V1 passes through oppositely disposed surface S1 and surface S2 of the sacrificial layer 120. In the present embodiment, the patterning process is, for example, a lithography and etching process, but the invention is not limited thereto. For example, the method of forming the notch V1 in the sacrificial layer 120 includes the following steps: performing a lithography process on a photoresist material layer (not shown) comprehensively formed on the sacrificial layer 120 to form a patterned photoresist layer (not shown), and then performing an etching process on the sacrificial layer 120 by using the patterned photoresist layer as a mask to form the notch V1.

Figure 1C:
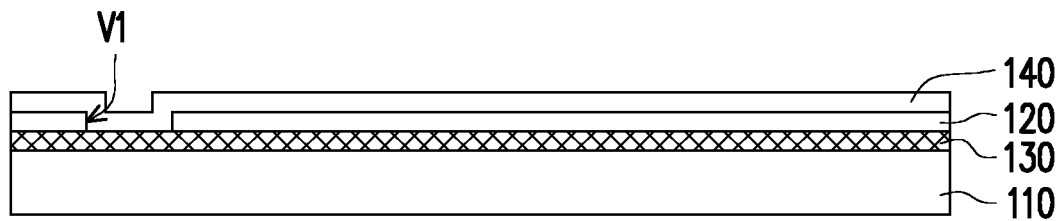

Next, referring to FIG. 1C, a conductive material layer 140 filled in the notch V1 is formed on the release layer 130. In the present embodiment, the forming method of the conductive material layer 140 may include physical vapor deposition, metal chemical vapor deposition, or electroplating. In addition, in the present embodiment, the etch selectivity for the sacrificial layer 120 to the conductive material layer 140 is greater than 5. That is, in the present embodiment, the material of the sacrificial layer 120, the material of the conductive material layer 140, and the etchant used in the etching process must be selected to achieve an etch selectivity greater than 5 for the sacrificial layer 120 to the conductive material layer 140, that is, in the etching process, a selected etchant selectively etches the sacrificial layer 120 without etching the conductive material layer 140. For example, when the material of the sacrificial layer 120 is molybdenum, titanium (Ti) may be used as the material of the conductive material layer 140; when the material of the sacrificial layer 120 is silver, molybdenum may be used as the material of the conductive material layer 140; and when the material of the sacrificial layer 120 is indium tin oxide, a metal such as titanium, molybdenum, or aluminum is used as the material of the conductive material layer 140. That is, in the present embodiment, the material of the conductive material layer 140 may include a metal.

Figure 1D:
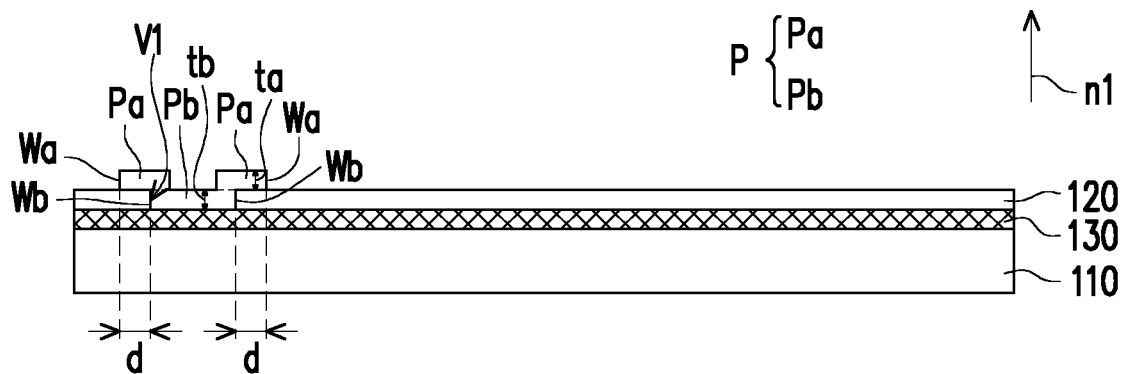

Next, referring to both FIGS. 1C and 1D, the conductive material layer 140 is patterned to form a pad P on the release layer 130. In the present embodiment, the patterning process is, for example, a lithography and etching process, but the invention is not limited thereto. For example, the method of patterning the conductive material layer 140 includes the following steps: performing a lithography process on a photoresist material layer (not shown) comprehensively formed on the conductive material layer 140 to form a patterned photoresist layer (not shown), and then performing an etching process on the conductive material layer 140 by using the patterned photoresist layer as a mask to form the pad P. Additionally, as previously described, the etch selectivity for the sacrificial layer 120 to the conductive material layer 140 is greater than 5, and therefore the etch selectivity for the sacrificial layer 120 to the pad P is also greater than 5.

Referring again to FIG. 1D, in the present embodiment, the pad P includes an embedded part Pa and a protruded part Pb, the protruded part Pb is filled in the notch V1, and the embedded part Pa is located on the sacrificial layer 120 and in contact with two ends of the protruded part Pb. That is, in the present embodiment, the pad P having the embedded part Pa and the protruded part Pb may be formed by a single patterning process. Moreover, from the cross-sectional structure shown in FIG. 1D, the embedded part Pa and the protruded part Pb show a concave structure. It is worth mentioning that although the cross-sectional structure shown in FIG. 1D shows that the embedded part Pa is in contact with two ends of the protruded part Pb, those having ordinary skill in the art should understand that the embedded part Pa actually may also be in contact with the protruded part Pb by surrounding the protruded part Pb, that is, the embedded part Pa may also be in contact with the other parts of the protruded part Pb other than the two ends.

In addition, as described above, the conductive material layer 140 may be patterned into the pad P having the embedded part Pa and the protruded part Pb via a single patterning process, and therefore the embedded part Pa and the protruded part Pb belong to the same film layer, and the interface at which the embedded part Pa is in contact with the protruded part Pb may have a continuous crystal structure. Moreover, in the present embodiment, the thickness tb of the protruded part Pb is substantially equal to the thickness ta of the embedded part Pa. In an embodiment, the thickness tb of the protruded part Pb and the thickness ta of the embedded part Pa may respectively be between about 10 Å and about 10,000 Å. In another embodiment, the thickness tb of the protruded part Pb and the thickness to of the embedded part Pa may respectively be between about 100 Å and about 10,000 Å.

Additionally, in the present embodiment, the vertical projection of the edge wa of the embedded part Pa on the carrier 110 is spaced apart from the vertical projection of the edge wb of the protruded part Pb on the carrier 110 by a distance d of about 1 micron to about 1,000 microns. That is, in the present embodiment, a part of the embedded part Pa is not overlapped with the protruded part Pb in a normal direction n1 of the carrier 110.

Figure 1E:
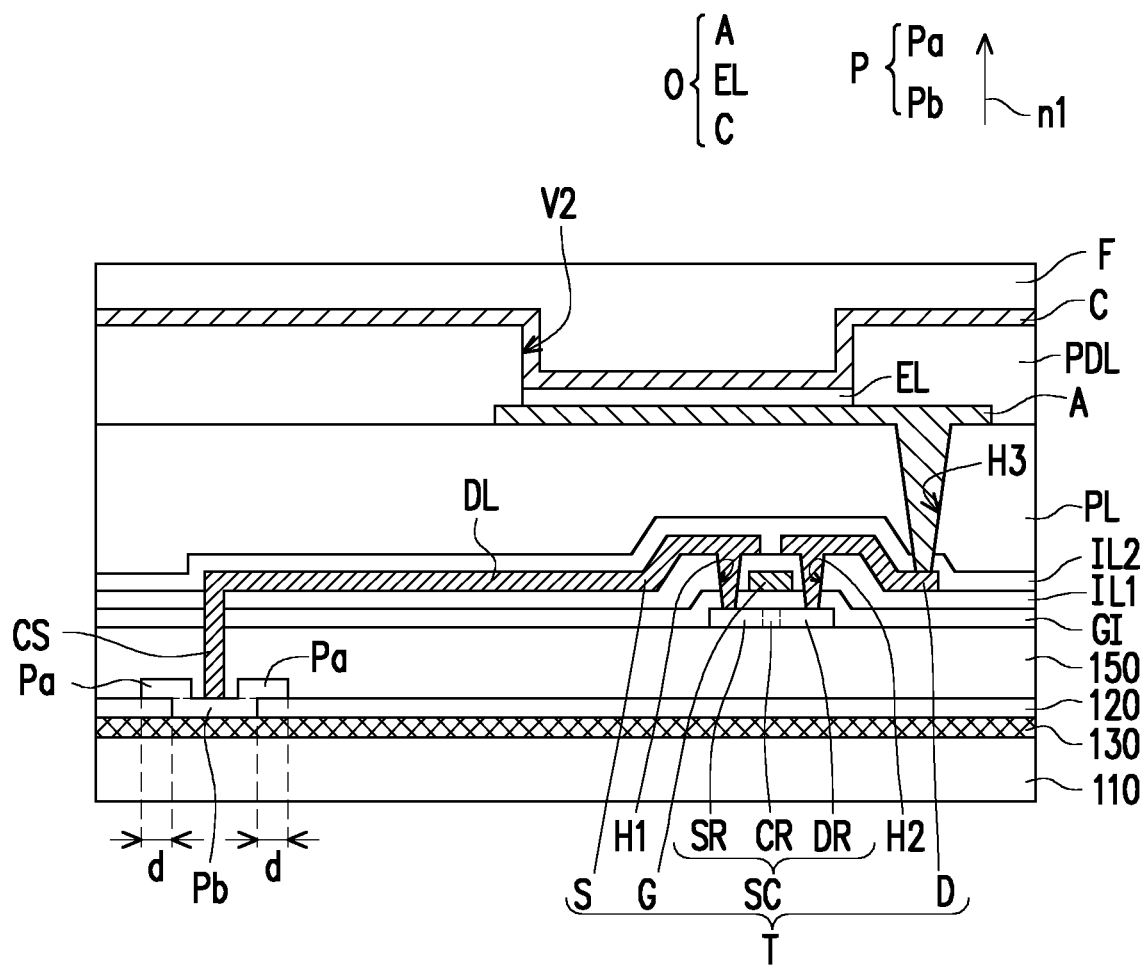

Next, referring to FIG. 1E, an insulating layer 150 is formed on the pad P and the sacrificial layer 120 such that the embedded part Pa of the pad P is located in the insulating layer 150. In the present embodiment, the forming method of the insulating layer 150 may include physical vapor deposition or chemical vapor deposition. Moreover, in the present embodiment, the material of the insulating layer 150 may include: an inorganic material (for example: silicon oxide, silicon nitride, silicon oxynitride, or a stacked layer of at least two of the above materials), an organic material (for example, a polyimide resin, epoxy resin, or acrylic resin), or a combination thereof, but the invention is not limited thereto. In the present embodiment, the insulating layer 150 is a single layer structure, but the invention is not limited thereto. In other embodiments, the insulating layer 150 may be a multilayer structure.

Referring again to FIG. 1E, an active element T electrically connected to the pad P is formed on the insulating layer 150. In the present embodiment, the method of forming the active element T may include the following steps: forming a semiconductor layer SC, a gate insulating layer GI, a gate G, an interlayer insulating layer ILL a source S, and a drain D on the insulating layer 150 in order, wherein the semiconductor layer SC includes a source region SR, a drain region DR, and a channel region CR formed by performing an ion doping process with the gate G as a mask, the gate G and the channel region CR are overlapped in a normal direction n, the source S is electrically connected to the source region SR via a contact hole H1 formed in the gate insulating layer GI and the interlayer insulating layer ILL and the drain D is electrically connected to the drain region DR via a contact hole H2 formed in the gate insulating layer GI and the interlayer insulating layer IL1, but the invention is not limited thereto. In the present embodiment, the semiconductor layer SC, the gate insulating layer GI, the gate G, the interlayer insulating layer IL1, the source S, and the drain D may respectively be implemented by any semiconductor layer, any gate insulating layer, any gate, any interlayer insulating layer, any source, and any drain for a display panel known to those having ordinary skill in the art, and the semiconductor layer SC, the gate insulating layer GI, the gate G, the interlayer insulating layer IL1, the source S, and the drain D may respectively be formed by any method known to those having ordinary skill in the art, and thus are not repeated herein. In the present embodiment, the active element T is exemplified by a low-temperature polysilicon thin-film transistor (LIPS TFT), but the invention does not limit the type of the active element. In other embodiments, the active element T may be an amorphous silicon TFT (a-Si TFT), a micro-Si TFT, or a metal oxide transistor. Further, in the present embodiment, the active element T is a top-gate thin-film transistor, but the invention is not limited thereto. In other embodiments, the active element T may be a bottom-gate thin-film transistor.

In the present embodiment, during the process of forming the source S and the drain D, a signal line DL and a connecting structure CS are also formed, wherein the connecting structure CS is located in the insulating layer 150, the gate insulating layer GI, and the interlayer insulating layer IL1 and is electrically connected to the pad P, and the signal line DL is electrically connected to the connecting structure CS and the source S of the active element T, but the invention is not limited thereto. From another point of view, in the present embodiment, the connecting structure CS and the signal line DL may be used to electrically connect the pad P and the active element T. In the present embodiment, the signal line DL is used as a data line, but the invention is not limited thereto. In other embodiments, the signal line DL may be used as a scan line, and the signal line DL is electrically connected to the connecting structure CS and the gate G of the active element T.

Referring again to FIG. 1E, after an interlayer insulating layer IL2 and a planarization layer PL covering the active element T are formed on the insulating layer 150 in order, an electrode A, a light-emitting layer EL, an electrode C, and a pixel definition layer PDL are formed on the planarization layer PL, wherein the electrode A is electrically connected to the drain D of the active element T via a contact hole H3 formed in the interlayer insulating layer IL1 and the planarization layer PL, and the light-emitting layer EL is disposed between the electrode A and the electrode C and formed in an opening V2 of the pixel definition layer PDL, but the invention is not limited thereto. In the present embodiment, the interlayer insulating layer IL1, the planarization layer PL, the electrode A, the light-emitting layer EL, the electrode C, and the pixel definition layer PDL may respectively be implemented by any interlayer insulating layer, any planarization layer, any electrode, any light-emitting layer, any electrode, and any pixel definition layer for a display panel known to those having ordinary skill in the art, and the interlayer insulating layer IL1, the planarization layer PL, the electrode A, the light-emitting layer EL, the electrode C, and the pixel definition layer PDL may respectively be formed by any method known to those having ordinary skill in the art, and thus are not repeated herein.

In the present embodiment, the light-emitting layer EL, the overlapped part of the electrode A and the light-emitting layer EL, and the overlapped part of the electrode C and the light-emitting layer EL form a display element O, wherein the active element T is electrically connected to the display element O to drive the display element O. In the present embodiment, the display element O emits light by driving the light-emitting layer EL through the voltage difference generated between the electrode A and the electrode C. For example, when the light-emitting layer EL is a red light-emitting layer, the display element O emits red light. In addition, although FIG. 1E only shows one active element T electrically connected to the display element O, those having ordinary skill in the art should understand that the display element O is actually driven by, for example, a driving unit having a 1T1C architecture, a 2T1C architecture, a 3T1C architecture, a 3T2C architecture, a 4T2C architecture, a 4T2C architecture, a 5T1C architecture, a 5T2C architecture, a 6T1C architecture, a 6T2C architecture, a 7T2C architecture, or any possible architecture. That is to say, in the present embodiment, the active element T is one element in the drive unit for driving the display element O.

Referring to FIG. 1E, after the display element O is formed, an encapsulation layer F is formed on the electrode C to cover the display element O for isolating the display element O from moisture, impurities, and the like. The material of the encapsulation layer F may include silicon nitride, aluminum oxide, silicon carbonitride (SiCN), silicon oxynitride, acrylic resin, hexamethyl disiloxane (HMDSO), or glass, but the invention is not limited thereto. In the present embodiment, the encapsulation layer F may be implemented by any encapsulation layer for a display panel known to those having ordinary skill in the art, and the encapsulation layer F may be formed by any method known to those having ordinary skill in the art and is therefore not repeated herein.

Figure 1F:
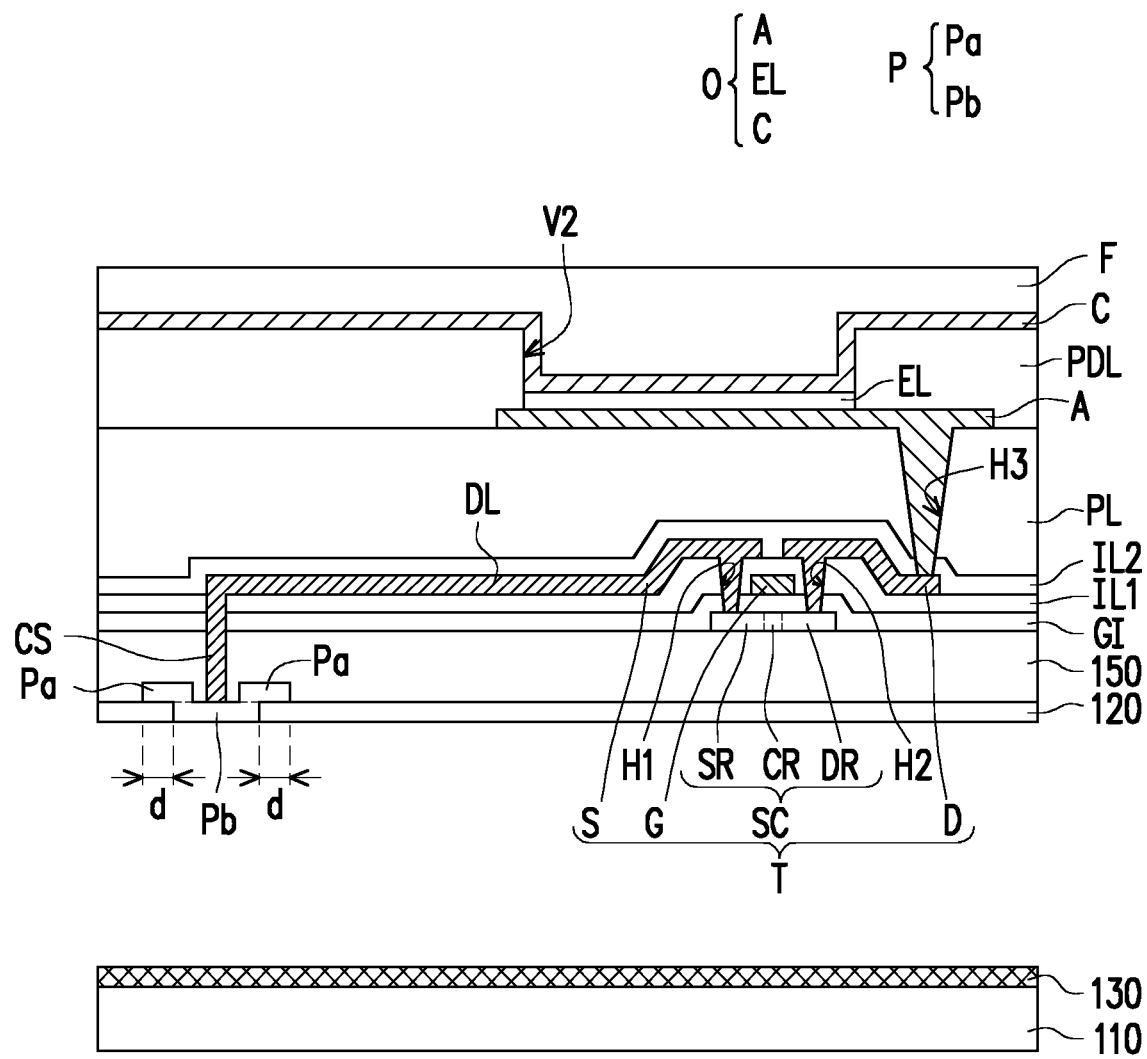

Next, referring to FIG. 1E and FIG. 1F, the release layer 130 is separated from the sacrificial layer 120 to expose the protruded part Pb of the pad P. In the present embodiment, the method of separating the release layer 130 from the sacrificial layer 120 may include a laser lift-off process or mechanical removal. However, the invention is not limited thereto. In other embodiments, the method of separating the release layer 130 from the sacrificial layer 120 may vary depending on the material of the release layer 130, and thus the invention does not limit the method of separating the release layer 130 from the sacrificial layer 120.

Figure 1G:
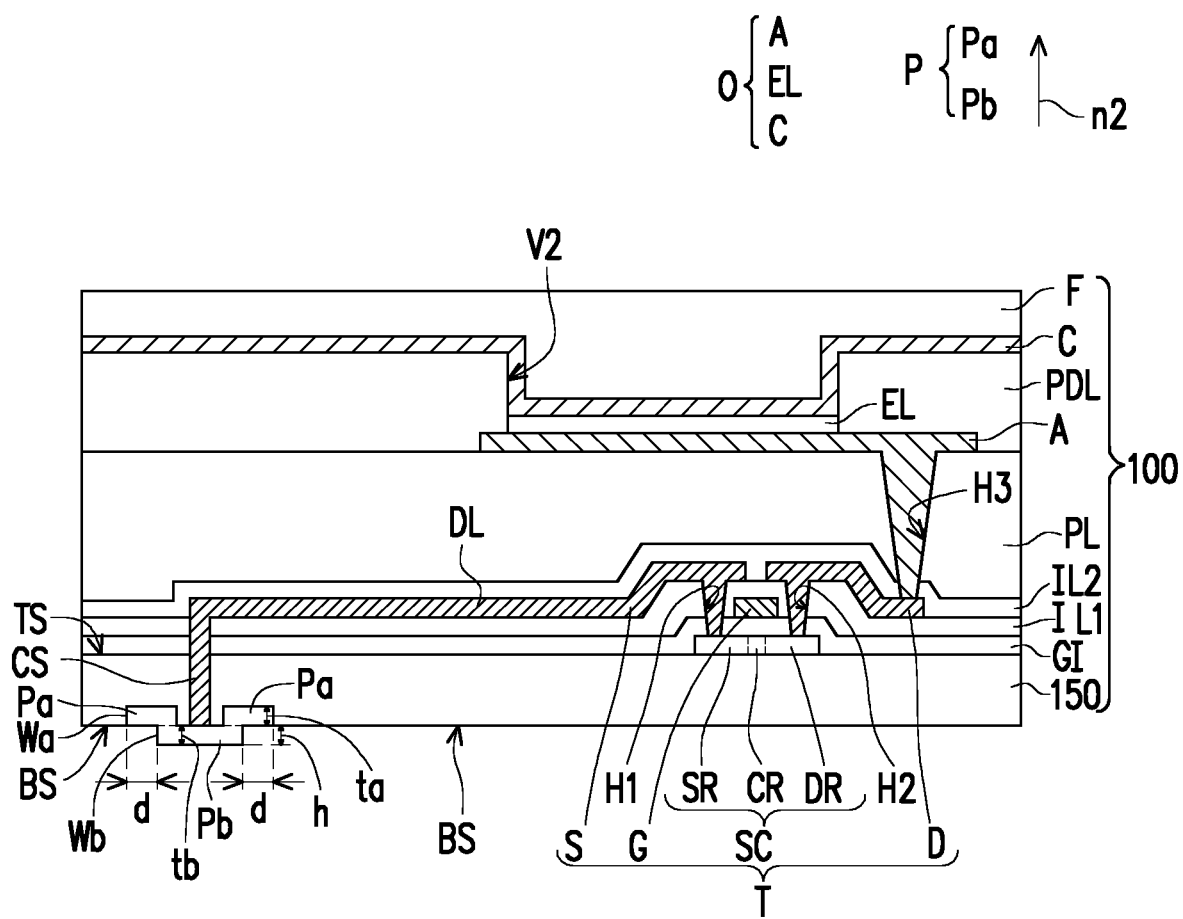

Next, referring to FIG. 1F and FIG. 1G, the sacrificial layer 120 is removed to expose the embedded part Pa of the pad P and form the array substrate 100. The method of removing the sacrificial layer 120 may include an etching process such as a wet etching process or a dry etching process. It is worth mentioning that, as mentioned above, the sacrificial layer 120 has a high etch selectivity (i.e., an etch selectivity greater than 5) to the pad P, and therefore when the etching process is performed to remove the sacrificial layer 120, the pad P may be effectively saved on the array substrate 100.

In the present embodiment, the array substrate 100 may include the insulating layer 150, the active element T, the signal line DL, the connecting structure CS, the display element O, the pixel definition layer PDL, the encapsulation layer F, the gate insulating layer GI, the interlayer insulating layer IL1, the interlayer insulating layer IL2, and the planarization layer PL, wherein the insulating layer 150 is used as the substrate of the array substrate 100, the active element T may include the semiconductor layer SC, the gate G, the source S, and the drain D, and the display element O may include the electrode A, the light-emitting layer EL, and the electrode C.

In the present embodiment, the insulating layer 150 (i.e., the substrate) has oppositely disposed top surface TS and bottom surface BS. As described above, since the insulating layer 150 is formed on the pad P after the forming of the pad P, and the active element T and the display element O are formed on the insulating layer 150 after the forming of the insulating layer 150, the active element T and the display element O may be considered as being disposed on the top surface TS, and the pad P may be considered as being disposed on the bottom surface BS.

Moreover, as described above, since the sacrificial layer 120, the pad P, and the insulating layer 150 are formed on the carrier 110 in order, and the protruded part Pb of the pad P is filled in the notch V1 of the sacrificial layer 120, after the sacrificial layer 120 is removed, the protruded part Pb of the pad P is protruded from the insulating layer 150. Specifically, in the present embodiment, the protruded part Pb of the pad P is protruded from the bottom surface BS of the insulating layer 150. Further, as described above, the thickness tb of the protruded part Pb is substantially equal to the thickness ta of the embedded part Pa, and therefore a protruding height h of the protruded part Pb is also substantially equal to the thickness ta of the embedded part Pa.

In addition, after the carrier 110 is removed, the vertical projection of the edge wa of the embedded part Pa on the insulating layer 150 (i.e., the substrate) of the array substrate 100 is still spaced apart from the vertical projection of the edge wb of the protruded part Pb on the insulating layer 150 (i.e., the substrate) of the array substrate 100 by the distance d. That is, in the present embodiment, on a normal direction n2 of the insulating layer 150 (i.e., the substrate) of the array substrate 100, a part of the embedded part Pa is not overlapped with the protruded part Pb.

Figure 1H:
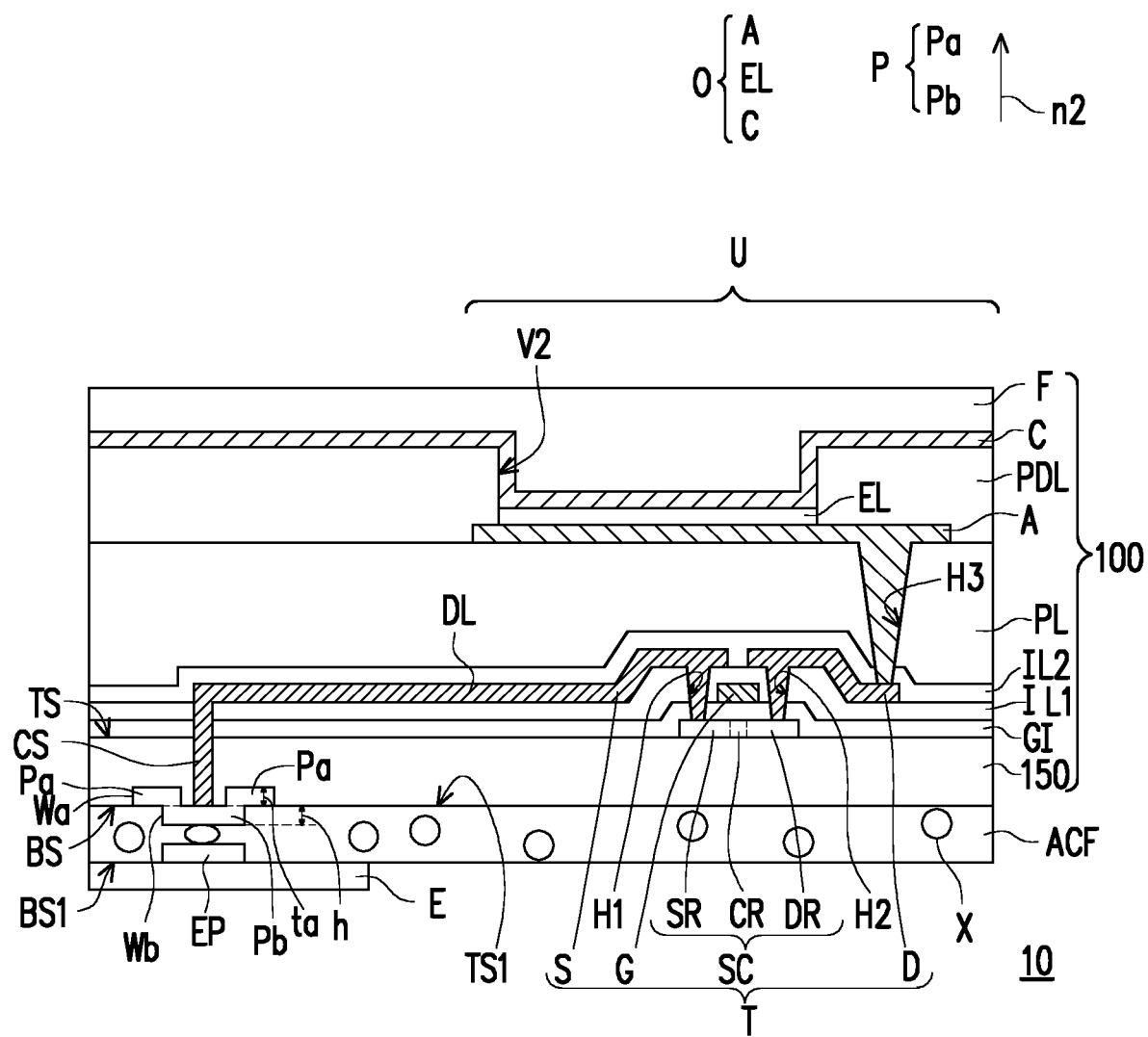

Referring to FIG. 1H, the array substrate 100 is bonded to the electronic element E via the anisotropic conductive layer ACF. In the present embodiment, the array substrate 100 may be electrically connected to the electronic element E via the pad P, the anisotropic conductive layer ACF and a pad EP of the electronic element E. That is to say, the array substrate 100 may be electrically connected to an external element (for example, the electronic element E) via the pad P. From another point of view, the pad P and the pad EP are respectively located at two opposite sides of the anisotropic conductive layer ACF. In general, the anisotropic conductive layer ACF includes a plurality of conductive particles X. Therefore, in the present embodiment, a part of the conductive particles X is squeezed by the pad P and the pad EP and located between the pad P and the pad EP to achieve the electrical connection between the pad P and the pad EP.

As shown in FIG. 1H, the pad P is located on a top surface TS1 of the anisotropic conductive layer ACF, and the pad EP is located on a bottom surface BS1 of the anisotropic conductive layer ACF. Moreover, in the present embodiment, the anisotropic conductive layer ACF is located between the array substrate 100 and the electronic element E, wherein the anisotropic conductive layer ACF is in contact with the insulating layer 150 (i.e., the substrate) of the array substrate 100. That is, the top surface TS1 of the anisotropic conductive layer ACF is in contact with the bottom surface BS of the insulating layer 150. In the present embodiment, the electronic element E may include a flexible circuit board and/or an integrated circuit chip.

After the above process steps, the display panel 10 of the present embodiment may be substantially completed. The display panel 10 may include the array substrate 100, the pad P, the anisotropic conductive layer ACF, and the electronic element E. The array substrate 100 may include the insulating layer 150 used as the substrate, the active element T, the display element O, and the connecting structure CS. The insulating layer 150 (i.e., the substrate) has oppositely disposed top surface TS and bottom surface BS. The active element T is disposed on the top surface TS. The display element O is disposed on the top surface TS and electrically connected to the active element T. The connecting structure CS is located in the insulating layer 150 (i.e., the substrate), and is electrically connected to the pad P and the active element T. The pad P is disposed on the bottom surface BS, and includes the embedded part Pa and the protruded part Pb, wherein the embedded part Pa is located in the insulating layer 150 (i.e., the substrate), and the protruded part Pb is protruded from the bottom surface BS of the insulating layer 150 (i.e., the substrate). In the present embodiment, the vertical projection of the edge wa of the embedded part Pa on the insulating layer 150 (i.e., the substrate) is spaced apart from the vertical projection of the edge wb of the protruded part Pb on the insulating layer 150 (i.e., the substrate) by the distance d of about 1 micron to about 1,000 microns. In the present embodiment, the embedded part Pa and the protruded part Pb belong to the same film layer. In the present embodiment, the protruding height h of the protruded part Pb is substantially equal to the thickness to of the embedded part Pa. The anisotropic conductive layer ACF is disposed between the array substrate 100 and the electronic element E, wherein the electronic element E is electrically connected to the array substrate 100 via the anisotropic conductive layer ACF and the pad P.

In the display panel 10 of the present embodiment, the pad P is disposed on the bottom surface BS of the insulating layer 150 (i.e., the substrate) of the array substrate 100, and includes the embedded part Pa located in the insulating layer 150 (i.e., the substrate) and the protruded part Pb protruded from the bottom surface BS of the insulating layer 150 (i.e., the substrate). Thereby, when the array substrate 100 is bonded to the electronic element E via the anisotropic conductive layer ACF, and the pad P and the electronic element E are electrically connected via the conductive particles X, cracking to the insulating layer 150 (i.e., the substrate) around the pad P due to the insulating layer 150 squeezing the conductive particles X is avoided, thereby improving process yield. That is, in the display panel 10 of the present embodiment, all of the pads (for example, the pad P) located on the top surface TS1 adjacent to the array substrate 100 of the anisotropic conductive layer ACF respectively include an embedded part and a protruded part (for example, the embedded part Pa and the protruded part Pb), and therefore process yield may be effectively improved.

Moreover, in the display panel 10 of the present embodiment, since the pad P is disposed on the bottom surface BS of the insulating layer 150 (i.e., the substrate), the electronic element E may be bonded under the array substrate 100. As a result, compared to the display panel of prior art in which the pad is generally disposed on the top surface of the substrate of the array substrate, the display panel 10 of the present embodiment may achieve the object of a narrow frame or no frame.

In addition, although the display panel 10 is exemplified by a light-emitting diode display panel, the invention does not limit the type of the display panel 10. In other embodiments, the display panel 10 may be a liquid crystal display panel, an electrophoretic display panel, a plasma display panel, or other suitable display panels.

In addition, for clarity, the manufacturing method of the display panel 10 shown in FIG. 1A to FIG. 1H is exemplified by only one pixel unit region U. In actuality, those having ordinary skill in the art should understand that the display panel 10 may include a plurality of pixel unit regions U arranged in array. In the following, other embodiments are described with reference to FIG. 2. It should be mentioned here that, the embodiments below adopt the reference numerals of the embodiments above and a portion of the content thereof, wherein the same or similar reference numerals are used to represent the same or similar devices and descriptions of the same technical content are omitted. The omitted portions are described in the previous embodiments and are not repeated in the following embodiments.

Figure 2:
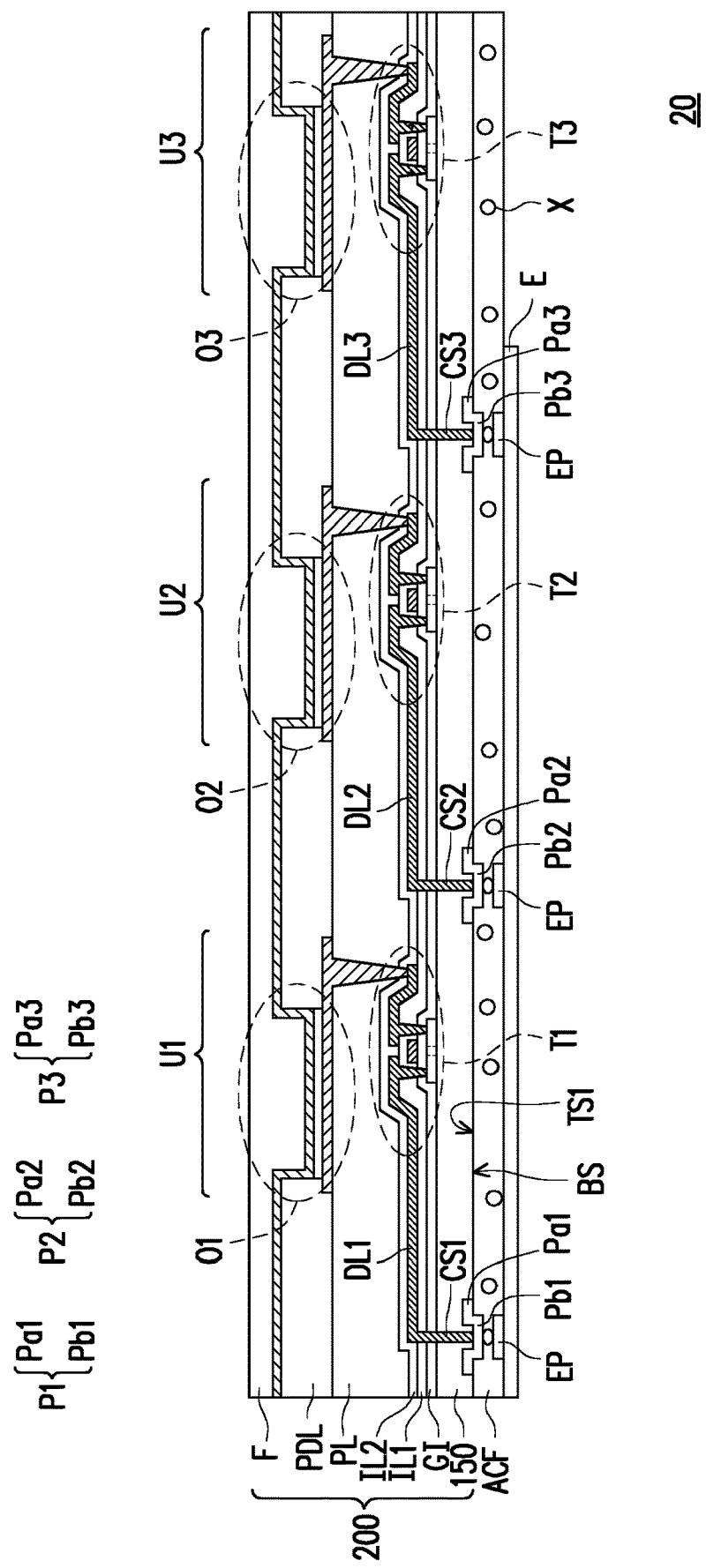
FIG. 2 is a cross section of a display panel according to another embodiment of the invention.
Figure 3:
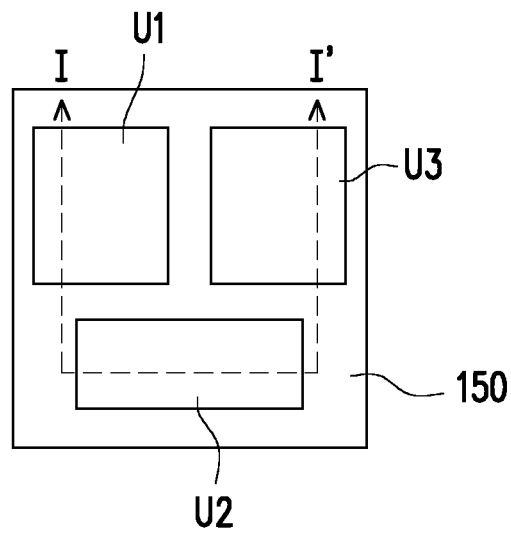
FIG. 3 is a top view of the display panel of FIG. 2.
Figure 4:
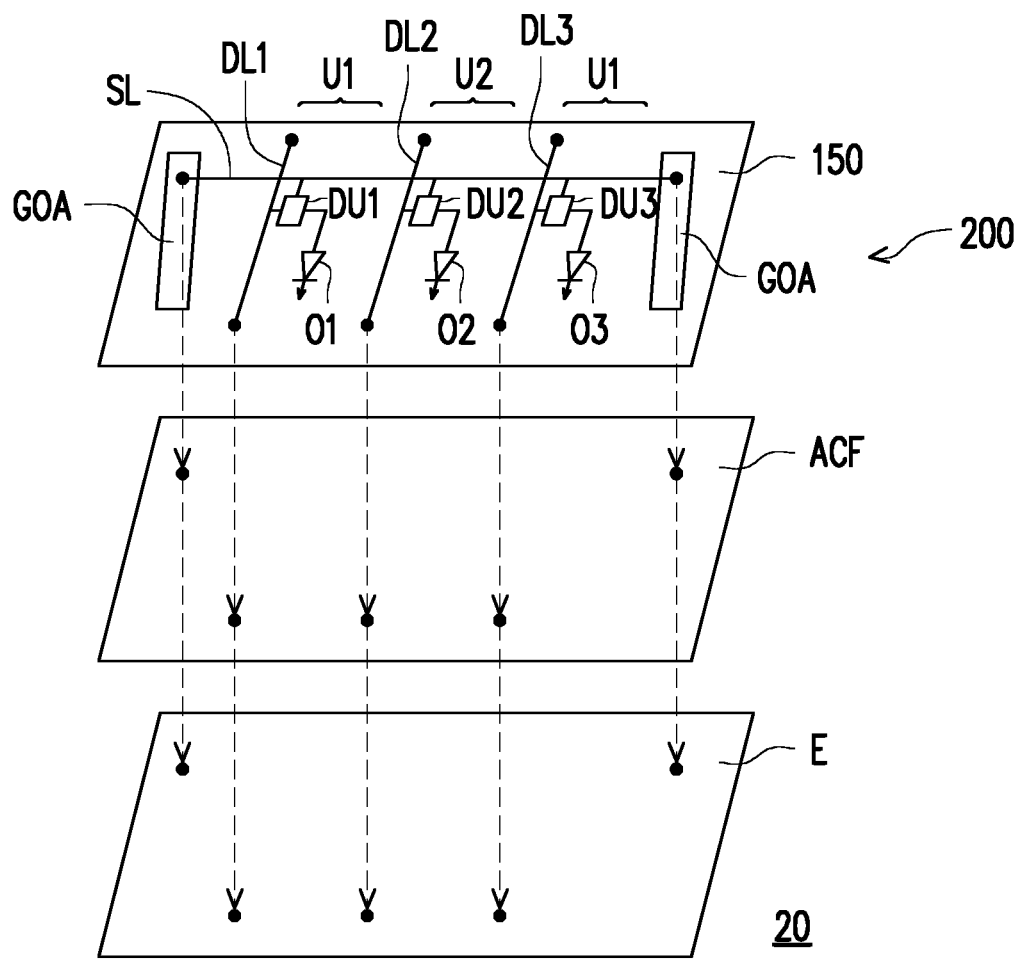
FIG. 4 is a schematic of the circuit and signal path of each film layer of the display panel of FIG. 2.

FIG. 2 is a cross section of a display panel according to another embodiment of the invention. FIG. 3 is a top view of the display panel of FIG. 2. FIG. 4 is a schematic of the circuit and signal path of each film layer of the display panel of FIG. 2. The cross-sectional position of FIG. 2 corresponds to the position of the section line I-I' of FIG. 3.

Referring to both FIG. 2 and FIG. 1H, a display panel 20 of FIG. 2 is similar to the display panel 10 of FIG. 1H, and the difference is mainly that the display panel 20 of FIG. 2 includes three pixel unit regions U1 to U3, and the display panel 10 of FIG. 1H includes only one pixel unit region U, and therefore the following description is made for the difference between the two, and the rest is as provided in the above embodiments and is not repeated.

Referring to all of FIG. 2, FIG. 3 and FIG. 4, in the present embodiment, an active element T1 and a display element O1 electrically connected to each other are disposed in the pixel unit region U1, an active element T2 and a display element O2 electrically connected to each other are disposed in the pixel unit region U2, and an active element T3 and a display element O3 electrically connected to each other are disposed in the pixel unit region U3. The active element T1, the active element T2, and the active element T3 may respectively be implemented by the active element T in the above embodiments, and therefore related descriptions are provided in the above embodiments and are not repeated herein. The display element O1, the display element O2, and the display element O3 may respectively be implemented by the display element O in the above embodiments, and related descriptions are provided in the above embodiments and are not repeated herein. In the present embodiment, the active element T1, the active element T2, and the active element T3 are disposed separately from one another on the top surface TS of the insulating layer 150 (for example, a substrate). In the present embodiment, the display element O1, the display element O2, and the display element O3 are disposed separately from one another on the top surface TS of the insulating layer 150 (i.e., the substrate). In addition, in the present embodiment, the display element O1, the display element O2, and the display element O3 may have different main wavelength ranges from one another, that is, the display element O1, the display element O2, and the display element O3 may emit light of different colors. For example, in an embodiment, the display element O1 emits red light, the display element O2 emits green light, and the display element O3 emits blue light.

Referring to FIG. 4, in the present embodiment, a signal line DL1 and the signal line SL are electrically connected to the display element O1 via a drive unit DU1 to drive the display element O1; a signal line DL2 and the signal line SL are electrically connected to the display element O2 via a drive unit DU2 to drive the display element O2; and a signal line DL3 and the signal line SL are electrically connected to the display element O3 via a drive unit DU3 to drive the display element O3. Based on the above embodiments, those having ordinary skill in the art should understand that the active element T1 is one element in the drive unit DU1, the active element T2 is one element in the drive unit DU2, and the active element T3 is one element in the drive unit DU3. The drive unit DU1, the drive unit DU2, and the drive unit DU3 may actually respectively have a 1T1C architecture, a 2T1C architecture, a 3T1C architecture, a 3T2C architecture, a 4T1C architecture, a 4T2C architecture, a 5T1C architecture, a 5T2C architecture, a 6T1C architecture, a 6T2C architecture, a 7T2C architecture, or any possible architecture.

In the present embodiment, the signal line SL is used as a scan line. In the present embodiment, the signal line SL may belong to the same film layer as the gate of the active element T1, the gate of the active element T2, and the gate of the active element T3. That is, in the present embodiment, the signal line SL, the gate of the active element T1, the gate of the active element T2, and the gate of the active element T3 may have substantially the same material, and the signal line SL, the gate of the active element T1, the gate of the active element T2, and the gate of the active element T3 may be formed in the same mask process.

Referring again to FIG. 4, in the present embodiment, an array substrate 200 may include a gate driving circuit GOA. The gate driving circuit GOA may be implemented by any gate driving circuit for a display panel known to those having ordinary skill in the art, and thus is not repeated herein. In the present embodiment, the signal line SL is electrically connected to the gate driving circuit GOA, and the gate driving circuit GOA is electrically connected to the electronic element E via the anisotropic conductive layer ACF. According to the description of the above embodiments, those having ordinary skill in the art should understand that in order to prevent cracking to the insulating layer 150 due to the bonding process via the anisotropic conductive layer ACF, the display panel 20 may include a plurality of pads electrically connected to the gate driving circuit GOA, and the pads are implemented by the pad P in the above embodiments. In addition, although FIG. 4 discloses that the array substrate 200 includes two gate driving circuits GOA, the invention is not limited thereto, and the number of the gate driving circuits GOA may be adjusted according to the actual architecture and requirements of the display panel 20.

Referring to all of FIG. 2, FIG. 3, and FIG. 4, in the present embodiment, the active element T1 may be electrically connected to the pad P1 via the signal line DL1 and a connecting structure CS1, the active element T2 may be electrically connected to the pad P2 via the signal line DL2 and a connecting structure CS2, and the active element T3 may be electrically connected to the pad P3 via the signal line DL3 and a connecting structure CS3. The signal line DL1, the signal line DL2, and the signal line DL3 may respectively be implemented by the signal line DL in the above embodiments, and therefore related descriptions are provided in the above embodiments and are not repeated herein. The connecting structure CS1, the connecting structure CS2, and the connecting structure CS3 may respectively be implemented by the connecting structure CS in the above embodiments, and therefore related descriptions are provided in the above embodiments and are not repeated herein. The pad P1, the pad P2, and the pad P3 may respectively be implemented by the pad P in the above embodiments, and therefore related descriptions are provided in the above embodiments and are not repeated herein.

Referring again to FIG. 2, FIG. 3, and FIG. 4, in the present embodiment, the active element T1 may be electrically connected to the electronic element E via the pad P1, the anisotropic conductive layer ACF and the pad EP of the electronic element E, the active element T2 may be electrically connected to the electronic element E via the pad P2, the anisotropic conductive layer ACF and the pad EP of the electronic element E, and the active element T3 may be electrically connected to the electronic element E via the pad P3, the anisotropic conductive layer ACF and the pad EP of the electronic element E. That is to say, in the present embodiment, the array substrate 200 may be electrically connected to an external element (for example, the electronic element E) via the pad P1, the pad P2, and the pad P3.

In the display panel 20 of the present embodiment, the pad P1, the pad P2, and the pad P3 are disposed on the bottom surface BS of the insulating layer 150 of the array substrate 200, the pad P1 includes an embedded part Pa1 located in the insulating layer 150 and a protruded part Pb1 protruded from the bottom surface BS of the insulating layer 150, the pad P2 includes an embedded part Pa2 located in the insulating layer 150 and a protruded part Pb2 protruded from the bottom surface BS of the insulating layer 150, and the pad P3 includes an embedded part Pa3 located in the insulating layer 150 and a protruded part Pb3 protruded from the bottom surface BS of the insulating layer 150. Therefore, when the array substrate 200 is bonded to the electronic element E via the anisotropic conductive layer ACF, and the pads P1 to P3 are electrically connected to the electronic element E, cracking to the insulating layer 150 around the pads P1 to P3 is avoided, thereby improving process yield. That is, in the display panel 20 of the present embodiment, all of the pads (such as the pads P1 to P3 and the pads electrically connected to the gate driving circuit GOA) located on the top surface TS1 of the anisotropic conductive layer ACF adjacent to the array substrate 200 respectively include an embedded part and a protruded part (such as the embedded parts Pa1 to Pa3 and the protruded parts Pb1 to Pb3), and therefore process yield may be effectively improved.

Moreover, in the display panel 20 of the present embodiment, since the pad P1, the pad P2, and the pad P3 are disposed on the bottom surface BS of the insulating layer 150, the electronic element E may be bonded under the array substrate 200. As a result, compared to the display panel of prior art in which the pad is generally disposed on the top surface of the substrate of the array substrate, the display panel 20 of the present embodiment may achieve the object of a narrow frame or no frame.

Moreover, in the display panel 20 of the present embodiment shown in FIG. 2 to FIG. 4, the array substrate 200 is electrically connected to the electronic element E via one anisotropic conductive layer ACF, but the invention is not limited thereto. In the following, other embodiments are described with reference to FIG. 5. It should be mentioned here that, the embodiments below adopt the reference numerals of the embodiments above and a portion of the content thereof, wherein the same or similar reference numerals are used to represent the same or similar devices and descriptions of the same technical content are omitted. The omitted portions are described in the previous embodiments and are not repeated in the following embodiments.

Figure 5:
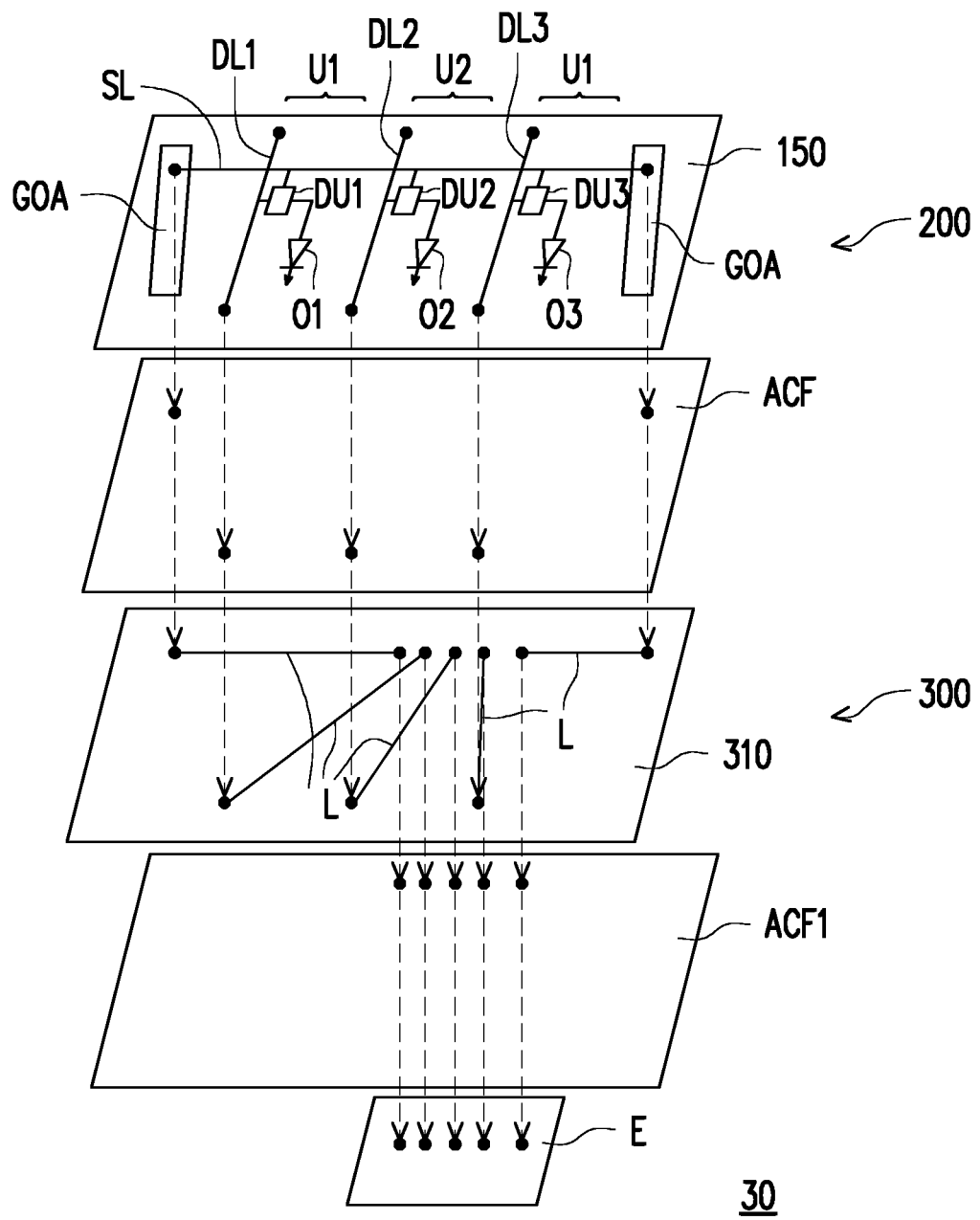
FIG. 5 is a schematic of the circuit and signal path of each film layer of a display panel according to another embodiment of the invention.

FIG. 5 is a schematic of the circuit and signal path of each film layer of a display panel according to another embodiment of the invention. Referring to both FIG. 5 and FIG. 4, a display panel 30 of FIG. 5 is similar to the display panel 20 of FIG. 4, and therefore the same or similar elements are represented by the same or similar reference numerals, and the same technical content is omitted. Descriptions of the omitted portions are provided in the above embodiments. Hereinafter, the difference between the display panel 30 of FIG. 5 and the display panel 20 of FIG. 4 is described.

Referring to FIG. 5, in the present embodiment, the display panel 30 may include a circuit layer 300 located between the array substrate 200 and the electronic element E. Specifically, as shown in FIG. 5, the circuit layer 300 includes an insulating layer 310 (for example, a substrate) and a plurality of collection lines L disposed on the insulating layer 310. In the present embodiment, the material of the insulating layer 310 may include: an inorganic material (for example: silicon oxide, silicon nitride, silicon oxynitride, or stacked layers of at least two of the above materials), an organic material (for example, a polyimide resin, an epoxy resin, or an acrylic resin), or a combination thereof, but the invention is not limited thereto.

In the present embodiment, the anisotropic conductive layer ACF is disposed between the array substrate 200 and the circuit layer 300. According to the descriptions of the embodiments of FIG. 2 to FIG. 4, those having ordinary skill in the art should understand that the array substrate 200 may be electrically connected to the circuit layer 300 via the anisotropic conductive layer ACF, the pad P1, the pad P2, the pad P3, and the pads electrically connected to the gate driving circuit GOA.

In the present embodiment, an anisotropic conductive layer ACF1 is disposed between the circuit layer 300 and the electronic element E. In addition, in the present embodiment, the circuit layer 300 is electrically connected to the electronic element E via the anisotropic conductive layer ACF1. According to the description of any of the above embodiments, those having ordinary skill in the art should understand that in order to prevent cracking to the insulating layer 310 of the circuit layer 300 due to the bonding process via the anisotropic conductive layer ACF1, the display panel 30 may include a plurality of pads electrically connected to the plurality of collection lines L, and the pads are implemented by the pad P in the above embodiments.

Based on the contents of any of the above embodiments and the present embodiment, those having ordinary skill in the art should understand that in the display panel 30 of the present embodiment, all of the pads (such as the pads P1 to P3 and the pads electrically connected to the gate driving circuit GOA) located on the top surface TS1 of the anisotropic conductive layer ACF adjacent to the array substrate 200 respectively include an embedded part and a protruded part (such as the embedded parts Pa1 to Pa3 and the protruded parts PM to Pb3), and all of the pads (such as the pads electrically connected to the collection lines L) located on the top surface of the anisotropic conductive layer ACF1 adjacent to the array substrate 200 respectively include an embedded part and a protruded part, and therefore process yield may be effectively improved.

In addition, since the display panel 30 of the present embodiment includes the circuit layer 300 provided with the plurality of collection lines L, the size of the electronic element E may be reduced.

In addition, in the display panel 30 shown in FIG. 5, the array substrate 200 includes the gate driving circuit GOA, but the invention is not limited thereto. In the following, other embodiments are described with reference to FIG. 6. It should be mentioned here that, the embodiments below adopt the reference numerals of the embodiments above and a portion of the content thereof, wherein the same or similar reference numerals are used to represent the same or similar devices and descriptions of the same technical content are omitted. The omitted portions are described in the previous embodiments and are not repeated in the following embodiments.

Figure 6:
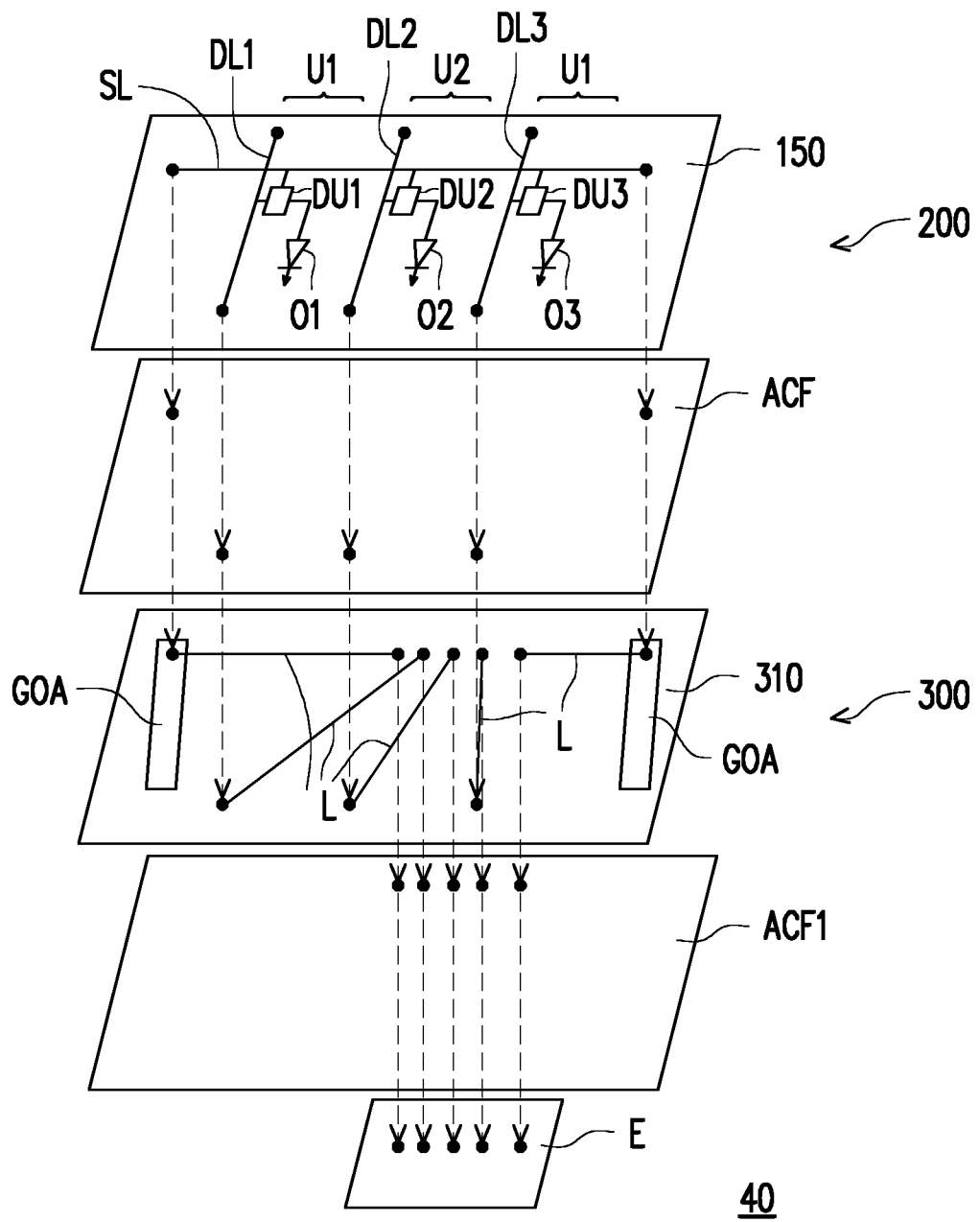
FIG. 6 is a schematic of the circuit and signal path of each film layer of a display panel according to another embodiment of the invention.

FIG. 6 is a schematic of the circuit and signal path of each film layer of a display panel according to another embodiment of the invention. Referring to both FIG. 6 and FIG. 5, a display panel 40 of FIG. 6 is similar to the display panel 30 of FIG. 5, and therefore the same or similar elements are represented by the same or similar reference numerals, and the same technical content is omitted. Descriptions of the omitted portions are provided in the above embodiments. Hereinafter, the difference between the display panel 40 of FIG. 6 and the display panel 30 of FIG. 5 is described.

Referring to both FIG. 6 and FIG. 5, the main difference between the display panel 40 of FIG. 6 and the display panel 30 of FIG. 5 is that in the display panel 40 of FIG. 6, the circuit layer 300 includes the gate driving circuit GOA; and in the display panel 30 of FIG. 5, the array substrate 200 includes the gate driving circuit GOA. That is, in the present embodiment, the signal line SL is electrically connected to the gate driving circuit GOA via the anisotropic conductive layer ACF, and the gate driving circuit GOA is electrically connected to the plurality of collection lines L. According to the description of any of the above embodiments, those having ordinary skill in the art should understand that in order to prevent cracking to the insulating layer 150 of the array substrate 200 due to the bonding process via the anisotropic conductive layer ACF, the display panel 40 may include a plurality of pads electrically connected to the signal line SL, and the pads are implemented by the pad P in the above embodiments.

Based on the contents of any of the above embodiments and the present embodiment, those having ordinary skill in the art should understand that in the display panel 40 of the present embodiment, all of the pads (such as the pads P1 to P3 and the pads electrically connected to the signal line SL) located on the top surface TS1 of the anisotropic conductive layer ACF adjacent to the array substrate 200 respectively include an embedded part and a protruded part (such as the embedded parts Pa1 to Pa3 and the protruded parts PM to Pb3), and all of the pads (such as the pads electrically connected to the collection lines L) located on the top surface of the anisotropic conductive layer ACF1 adjacent to the array substrate 200 respectively include an embedded part and a protruded part, and therefore process yield may be effectively improved.

In addition, since the display panel 40 of the present embodiment includes the circuit layer 300 provided with the plurality of collection lines L, the size of the electronic element E may be reduced.

In addition, in the display panel 20 shown in FIG. 2 to FIG. 4, the display panel 30 shown in FIG. 5, and the display panel 40 shown in FIG. 6, the array substrate 200 includes the active element T1, the active element T2, and the active element T3 disposed separately from one another on the top surface TS of the insulating layer 150 (for example, a substrate), but the invention is not limited thereto. In the following, other embodiments are described with reference to FIG. 7 and FIG. 8. It should be mentioned here that, the embodiments below adopt the reference numerals of the embodiments above and a portion of the content thereof, wherein the same or similar reference numerals are used to represent the same or similar devices and descriptions of the same technical content are omitted. The omitted portions are described in the previous embodiments and are not repeated in the following embodiments.

Figure 7:
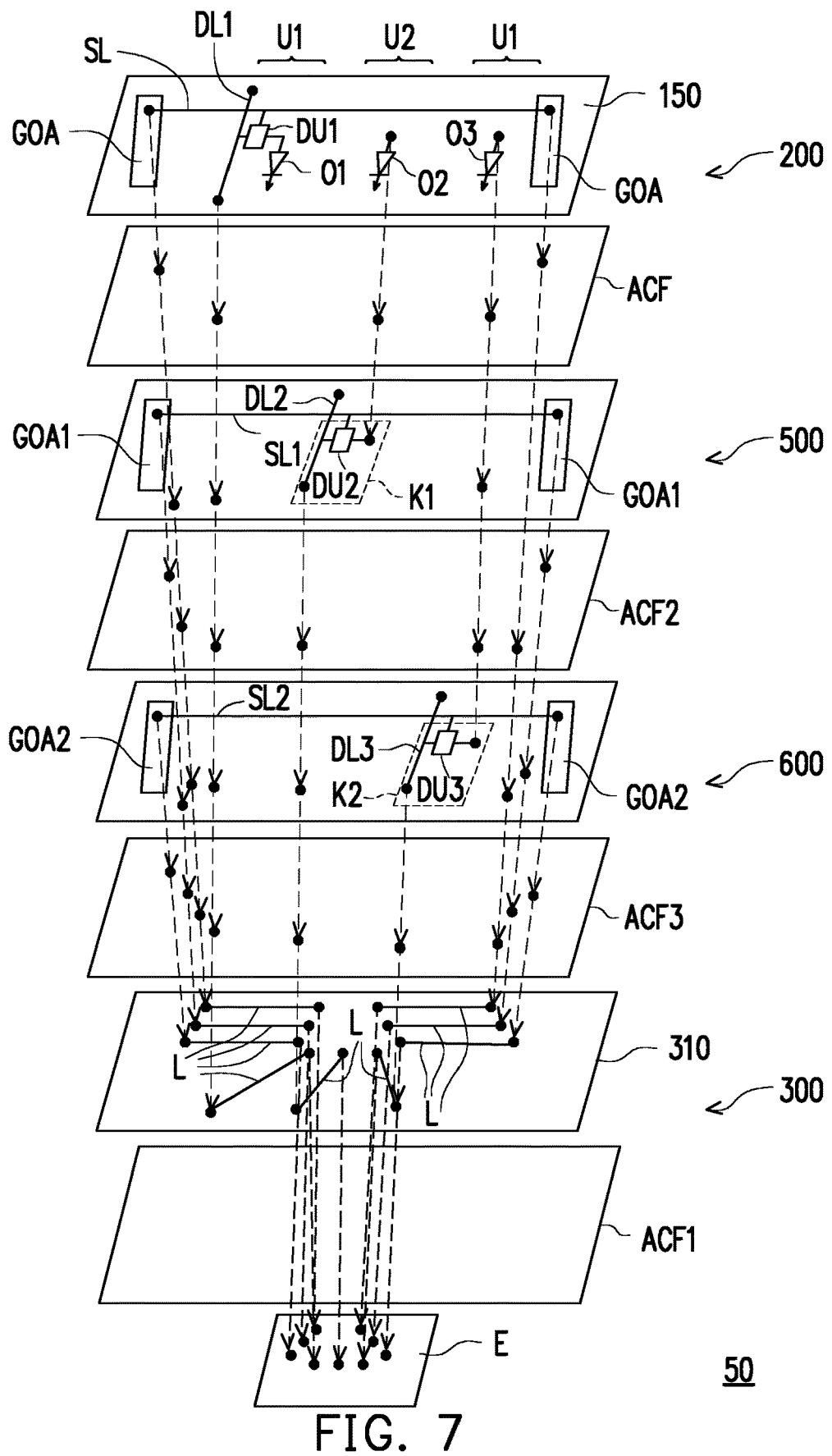
FIG. 7 is a schematic of the circuit and signal path of each film layer of a display panel according to another embodiment of the invention.
Figure 8:
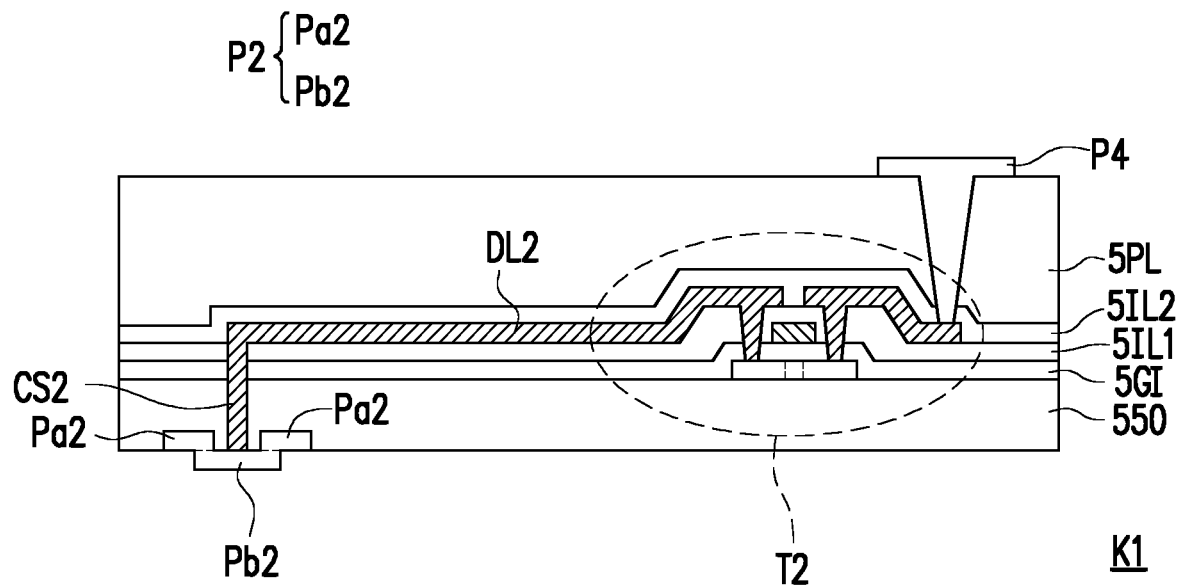
FIG. 8 is a cross section of region K1 in FIG. 7.
Figure 9:
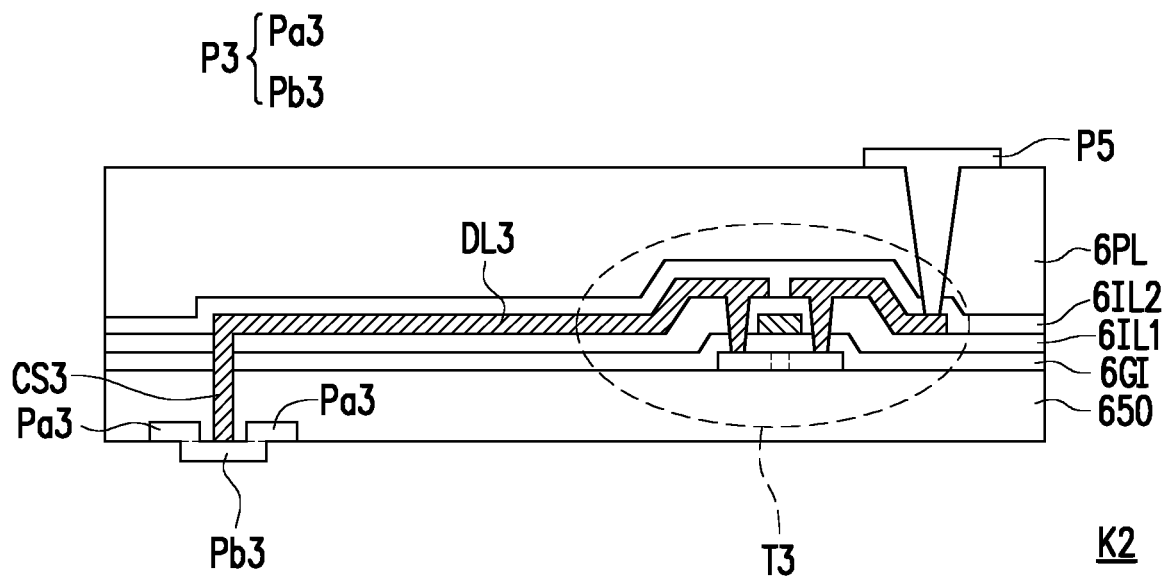
FIG. 9 is a cross section of region K2 in FIG. 7.

FIG. 7 is a schematic of the circuit and signal path of each film layer of a display panel according to another embodiment of the invention. FIG. 8 is a cross section of region K1 in FIG. 7. FIG. 9 is a cross section of region K2 in FIG. 7. Referring to both FIG. 7 and FIG. 5, a display panel 50 of FIG. 7 is similar to the display panel 40 of FIG. 5, and therefore the same or similar elements are represented by the same or similar reference numerals, and the same technical content is omitted. Descriptions of the omitted portions are provided in the above embodiments. Hereinafter, the difference between the display panel 50 of FIG. 7 and the display panel 40 of FIG. 5 is described.

Referring to FIG. 7, in the present embodiment, the display panel 50 may include another array substrate 500 located between the array substrate 200 and the circuit layer 300. Referring to both FIG. 7 and FIG. 8, the array substrate 500 may include an insulating layer 550, an active element T2, a signal line SL1, a signal line DL2, a connecting structure CS2, a gate driving circuit GOA1, a gate insulating layer SG1, an interlayer insulating layer 5IL1, an interlayer insulating layer 5IL2, and a planarization layer 5PL, wherein the insulating layer 550 is used as the substrate of the array substrate 500, the signal line SL1 is used as a scan line, the signal line SL1 may belong to the same film layer as the gate of the active element T2, the driving unit DU2 is electrically connected to the signal line DL2 and the signal line SL1, and the signal line SL1 is electrically connected to the gate driving circuit GOA1. In other words, in the present embodiment, the active element T2 and the display element O2 disposed in the pixel unit region U2 are respectively located in the array substrate 500 and the array substrate 200, that is, the active element T2 and the display element O2 electrically connected to each other are disposed on different horizontal planes within the same pixel unit region U2. The insulating layer 550, the gate insulating layer 5GI, the interlayer insulating layer 5IL1, the interlayer insulating layer 5IL2, and the planarization layer 5PL may be the same or similar to their counterparts in the embodiment of FIG. 2 (i.e., the insulating layer 150, the gate insulating layer GI, the interlayer insulating layer IL1, the interlayer insulating layer IL2, and the planarization layer PL), and therefore related descriptions are not repeated. The gate driving circuit GOA1 may be implemented by any gate driving circuit for a display panel known to those having ordinary skill in the art, and thus is not repeated herein.

Referring to FIG. 7 and FIG. 8 again, in the present embodiment, the display element O2 in the array substrate 200 may be electrically connected to the active element T2 in the array substrate 500 via the anisotropic conductive layer ACF and a pad P4. According to the description of any of the above embodiments, those having ordinary skill in the art should understand that in order to prevent cracking to the insulating layer 150 of the array substrate 200 due to the bonding process via the anisotropic conductive layer ACF, the display panel 50 may include a pad electrically connected to the display element O2, and the pad is implemented by the pad P in the above embodiments. Moreover, in the present embodiment, the anisotropic conductive layer ACF is disposed between the array substrate 200 and the array substrate 500.

Moreover, referring to FIG. 7, in the present embodiment, the display panel 50 may include yet another array substrate 600 located between the array substrate 500 and the circuit layer 300. Referring to both FIG. 7 and FIG. 9, the array substrate 600 may include an insulating layer 650, an active element T3, a signal line SL2, a signal line DL3, a connecting structure CS3, a gate driving circuit GOA2, a gate insulating layer 6GI, an interlayer insulating layer 6IL1, an interlayer insulating layer 6IL2, and a planarization layer 6PL, wherein the insulating layer 650 is used as the substrate of the array substrate 600, the signal line SL2 is used as a scan line, the signal line SL2 may belong to the same film layer as the gate of the active element T3, the driving unit DU3 is electrically connected to the signal line DL3 and the signal line SL2, and the signal line SL2 is electrically connected to the gate driving circuit GOA2. In other words, in the present embodiment, the active element T3 and the display element O3 disposed in the pixel unit region U3 are respectively located in the array substrate 600 and the array substrate 200, that is, the active element T3 and the display element O3 electrically connected to each other are disposed on different horizontal planes within the same pixel unit region U3. The insulating layer 650, the gate insulating layer 6GI, the interlayer insulating layer 61L1, the interlayer insulating layer 6IL2, and the planarization layer 6PL may be the same or similar to their counterparts in the embodiment of FIG. 2 (i.e., the insulating layer 150, the gate insulating layer GI, the interlayer insulating layer IL1, the interlayer insulating layer IL2, and the planarization layer PL), and therefore related descriptions are not repeated. The gate driving circuit GOA2 may be implemented by any gate driving circuit for a display panel known to those having ordinary skill in the art, and thus is not repeated herein.

Referring to FIG. 7 and FIG. 9 again, in the present embodiment, the display element O3 in the array substrate 200 may be electrically connected to the active element T3 in the array substrate 600 via the anisotropic conductive layer ACF, the anisotropic conductive layer ACF2, and a pad P5. According to the description of any of the above embodiments, those having ordinary skill in the art should understand that in order to prevent cracking to the insulating layer 150 of the array substrate 200 due to the bonding process via the anisotropic conductive layer ACF, the display panel 50 may include a pad electrically connected to the display element O3, and the pad is implemented by the pad P in the above embodiments. Moreover, in the present embodiment, the anisotropic conductive layer ACF2 is disposed between the array substrate 500 and the array substrate 600.

Referring to both FIG. 7 and FIG. 8, in the present embodiment, the active element T2 in the array substrate 500 may be electrically connected to the circuit layer 300 via the pad P2, the anisotropic conductive layer ACF2, and an anisotropic conductive layer ACF3. That is, in the present embodiment, the pad P2 is disposed on the top surface of the anisotropic conductive layer ACF2 adjacent to the array substrate 500, and the anisotropic conductive layer ACF3 is disposed between the array substrate 600 and the circuit layer 300.

Referring to both FIG. 7 and FIG. 9, in the present embodiment, the active element T3 in the array substrate 600 may be electrically connected to the circuit layer 300 via the pad P3 and the anisotropic conductive layer ACF3. That is to say, in the present embodiment, the pad P3 is disposed on the top surface of the anisotropic conductive layer ACF3 adjacent to the array substrate 600.

Referring to FIG. 7, in the present embodiment, the gate driving circuit GOA is electrically connected to the electronic element E via the anisotropic conductive layer ACF, the anisotropic conductive layer ACF2, the anisotropic conductive layer ACF3, and the anisotropic conductive layer ACF1, the gate driving circuit GOA1 is electrically connected to the electronic element E via the anisotropic conductive layer ACF2, the anisotropic conductive layer ACF3, and the anisotropic conductive layer ACF1, and the gate driving circuit GOA2 is electrically connected to the electronic element E via the anisotropic conductive layer ACF3 and the anisotropic conductive layer ACF1. In addition, according to the description of any of the above embodiments, those having ordinary skill in the art should understand that, similar to the gate driving circuit GOA, in order to improve process yield, the display panel 50 may include a plurality of pads electrically connected to the gate driving circuit GOA1, and include a plurality of pads electrically connected to the gate driving circuit GOA2, and the pads are implemented by the pad P in the above embodiments.

Based on the contents of any of the above embodiments and the present embodiment, those having ordinary skill in the art should understand that in the display panel 50 of the present embodiment, all of the pads (for example, the pad P1, the pad electrically connected to the display element O2, the pad electrically connected to the display element O3, and the pads electrically connected to the gate driving circuit GOA) located on the top surface TS1 of the anisotropic conductive layer ACF adjacent to the array substrate 200 respectively include an embedded part and a protruded part (for example, the embedded part Pa1 and the protruded part Pb1), all of the pads (for example, the pad P2 and the pads electrically connected to the gate driving circuit GOA1) located on the top surface of the anisotropic conductive layer ACF2 adjacent to the array substrate 200 respectively include an embedded part and a protruded part (for example, the embedded part Pa2 and the protruded part Pb2), all of the pads (for example, the pad P3 and the pads electrically connected to the gate driving circuit GOA2) located on the top surface of the anisotropic conductive layer ACF3 adjacent to the array substrate 200 respectively include an embedded part and a protruded part (for example, the embedded part Pa3 and the protruded part Pb3), and all of the pads (for example, the pads electrically connected to the collection lines L) located on the top surface of the anisotropic conductive layer ACF1 adjacent to the array substrate 200 respectively include an embedded part and a protruded part. Therefore, process yield may be effectively improved.

In addition, the display panel 50 of the present embodiment includes a plurality of array substrates (i.e., the array substrate 200, the array substrate 500, and the array substrate 600) stacked on one another, and therefore the active element and the display element located in the same pixel unit region may be disposed in different array substrates. For example, the active element T2 and the display element O2 located in the same pixel unit region U2 are respectively disposed in the array substrate 500 and the array substrate 200, and the active element T3 and the display element O3 located in the same pixel unit region U3 are respectively disposed in the array substrate 600 and the array substrate 200. Therefore, the layout area of each pixel unit region of the display panel 50 of the present embodiment may be reduced, thereby improving resolution.

In addition, since the display panel 50 of the present embodiment includes the circuit layer 300 provided with the plurality of collection lines L, the size of the electronic element E may be reduced.

In addition, in the display panel 50 shown in FIG. 7, the array substrate 200, the array substrate 500, and the array substrate 600 all include a gate driving circuit, but the invention is not limited thereto. In the following, other embodiments are described with reference to FIG. 10. It should be mentioned here that, the embodiments below adopt the reference numerals of the embodiments above and a portion of the content thereof, wherein the same or similar reference numerals are used to represent the same or similar devices and descriptions of the same technical content are omitted. The omitted portions are described in the previous embodiments and are not repeated in the following embodiments.

Figure 10:
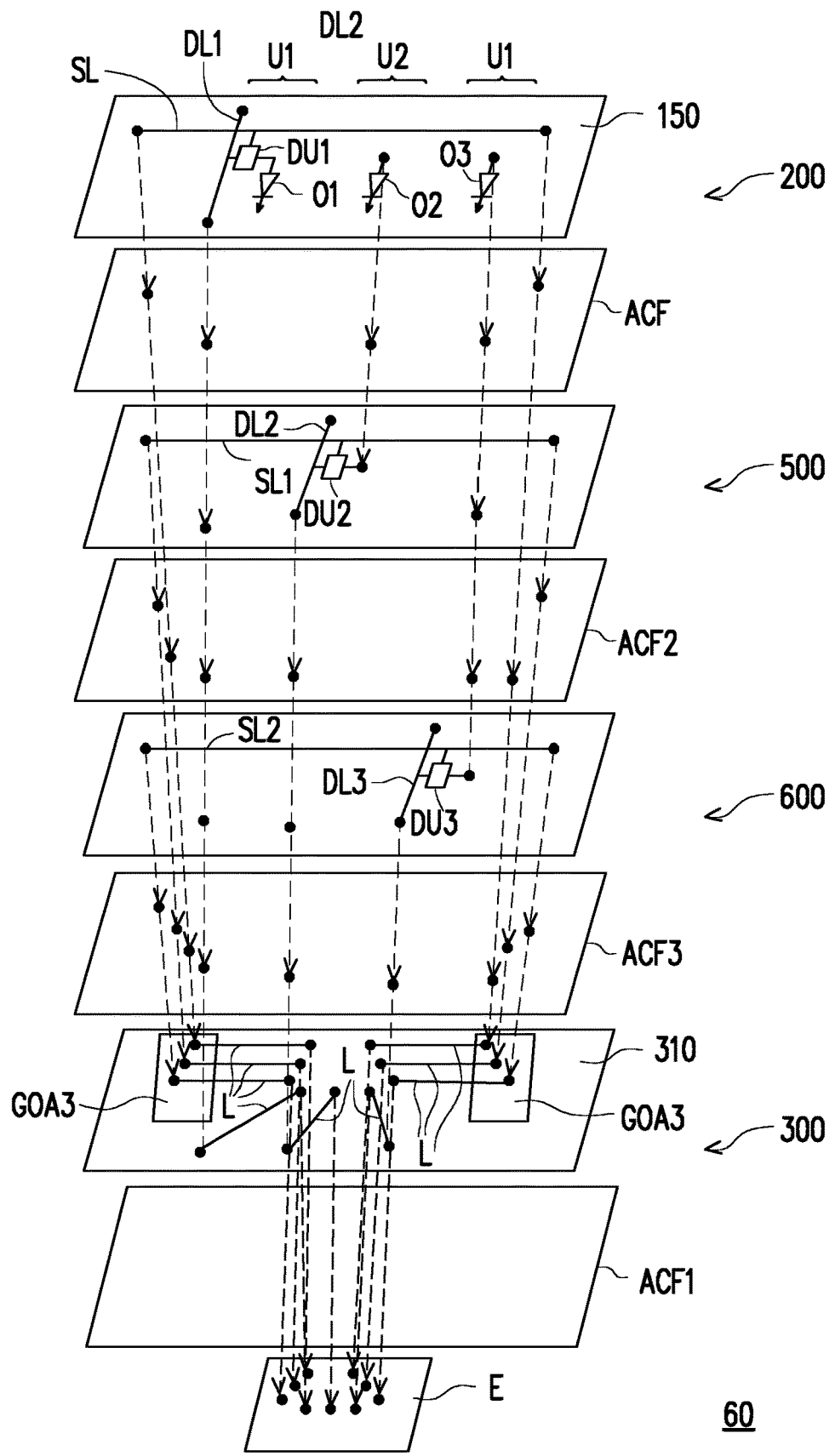
FIG. 10 is a schematic of the circuit and signal path of each film layer of a display panel according to another embodiment of the invention.

FIG. 10 is a schematic of the circuit and signal path of each film layer of a display panel according to another embodiment of the invention. Referring to both FIG. 10 and FIG. 7, a display panel 60 of FIG. 10 is similar to the display panel 50 of FIG. 7, and therefore the same or similar elements are represented by the same or similar reference numerals, and the same technical content is omitted. Descriptions of the omitted portions are provided in the above embodiments. Hereinafter, the difference between the display panel 60 of FIG. 10 and the display panel 50 of FIG. 7 is described.

Referring to both FIG. 10 and FIG. 7, the main difference between the display panel 60 of FIG. 10 and the display panel 50 of FIG. 7 is that only the circuit layer 300 of the display panel 60 of FIG. 10 includes a gate driving circuit GOA3; and the array substrate 200, the array substrate 500, and the array substrate 600 of the display panel 50 of FIG. 7 respectively include the gate driving circuit GOA, the gate driving circuit GOA1, and the gate driving circuit GOA2. That is, in the present embodiment, the signal line SL is electrically connected to the gate driving circuit GOA3 via the anisotropic conductive layer ACF, the anisotropic conductive layer ACF2, and the anisotropic conductive layer ACF3, the signal line SL1 is electrically connected to the gate driving circuit GOA3 via the anisotropic conductive layer ACF2 and the anisotropic conductive layer ACF3, the signal line SL2 is electrically connected to the gate driving circuit GOA3 via the anisotropic conductive layer ACF3, and the gate driving circuit GOA3 is electrically connected to the plurality of collection lines L. According to the description of any of the above embodiments, those having ordinary skill in the art should understand that in order to improve process yield, the display panel 60 may include a plurality of pads electrically connected to the signal line SL, the signal line SL1, and the signal line SL2, and the pads are implemented by the pad P in the above embodiments.

Based on the contents of any of the above embodiments and the present embodiment, those having ordinary skill in the art should understand that in the display panel 60 of the present embodiment, all of the pads (for example, the pad P1, the pad electrically connected to the display element O2, the pad electrically connected to the display element O3, and the pads electrically connected to the signal line SL) located on the top surface TS1 of the anisotropic conductive layer ACF adjacent to the array substrate 200 respectively include an embedded part and a protruded part (for example, the embedded part Pa1 and the protruded part Pb1), all of the pads (for example, the pad P2 and the pads electrically connected to the signal line SL1) located on the top surface of the anisotropic conductive layer ACF2 adjacent to the array substrate 200 respectively include an embedded part and a protruded part (for example, the embedded part Pa2 and the protruded part Pb2), all of the pads (for example, the pad P3 and the pads electrically connected to the signal line SL2) located on the top surface of the anisotropic conductive layer ACF3 adjacent to the array substrate 200 respectively include an embedded part and a protruded part (for example, the embedded part Pa3 and the protruded part Pb3), and all of the pads (for example, the pads electrically connected to the collection lines L) located on the top surface of the anisotropic conductive layer ACF1 adjacent to the array substrate 200 respectively include an embedded part and a protruded part. Therefore, process yield may be effectively improved.

In addition, the display panel 60 of the present embodiment includes a plurality of array substrates (i.e., the array substrate 200, the array substrate 500, and the array substrate 600) stacked on one another, and therefore the active element and the display element located in the same pixel unit region may be disposed in different array substrates. Therefore, the layout area of each pixel unit region of the display panel 60 of the present embodiment may be reduced, thereby improving resolution.

In addition, since the display panel 60 of the present embodiment includes the circuit layer 300 provided with the plurality of collection lines L, the size of the electronic element E may be reduced.

In addition, in the manufacturing method of the display panel 10 shown in FIG. 1A to FIG. 1H, the notch V1 formed in the sacrificial layer 120 passes through the sacrificial layer 120 (as shown in FIG. 1B), but the invention is not limited thereto. In the following, other embodiments are described with reference to FIG. 11. It should be mentioned here that, the embodiments below adopt the reference numerals of the embodiments above and a portion of the content thereof, wherein the same or similar reference numerals are used to represent the same or similar devices and descriptions of the same technical content are omitted. The omitted portions are described in the previous embodiments and are not repeated in the following embodiments.

Figure 11:
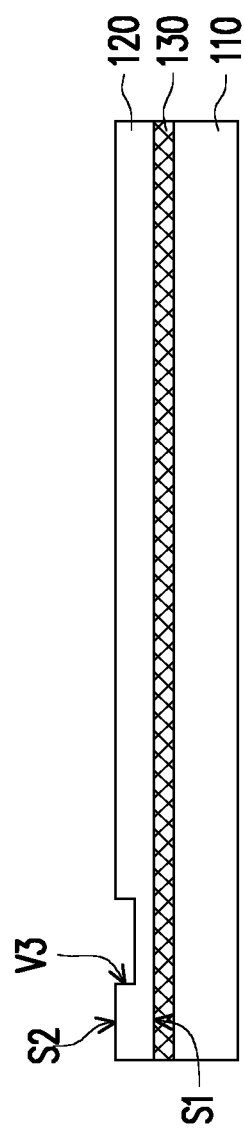
FIG. 11 is a cross section of a step in a manufacturing process of a display panel according to another embodiment of the invention.

FIG. 11 is a cross section of a step in a manufacturing process of a display panel according to another embodiment of the invention. Referring to FIG. 11, in the present embodiment, a notch V3 formed by the patterning process of the sacrificial layer 120 does not pass through the sacrificial layer 120. In other words, in the present embodiment, the notch V3 does not pass through the oppositely disposed surface S1 and surface S2 of the sacrificial layer 120. Although the invention does not disclose other steps in the manufacturing process of the display panel of the present embodiment, according to the relevant descriptions of the manufacturing method for the display panel 10 (i.e., relevant descriptions for FIG. 1A to FIG. 1H), those having ordinary skill in the art should understand the manufacturing method of the display panel of the present embodiment and the specific structure and layout and the like of the display panel of the present embodiment which not described in detail herein.

Based on the above, in the display panel of each embodiment of the invention, the included pad is disposed on the bottom surface of the substrate of the array substrate, and includes an embedded part located in the substrate of the array substrate and a protruded part protruded from the bottom surface of the substrate of the array substrate. As a result, when the array substrate is bonded to the electronic element via an anisotropic conductive layer, cracking to the substrate of the array substrate around the pad may be avoided when the pad is electrically connected to the electronic element, thereby improving process yield.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A display panel, comprising:
 a first array substrate, comprising:
  a first substrate having a top surface and a bottom surface disposed opposite to each other;
  a first active element disposed on the top surface of the first substrate;
  a first display element disposed on the top surface of the first substrate and electrically connected to the first active element; and
  a second display element disposed on the top surface of the first substrate and disposed separately from the first display element; and
 a first pad and a second pad disposed on the bottom surface of the first substrate, wherein the first active element is electrically connected to the first pad, each of the first pad and the second pad comprises an embedded part and a protruded part, the embedded part is located in the first substrate, and the protruded part is protruded from the bottom surface of the first substrate, wherein a vertical projection of an edge of the embedded part of the first pad on the first substrate is 1 micron to 1000 microns apart from a vertical projection of an edge of the protruded part of the first pad on the first substrate, and a vertical projection of an edge of the embedded part of the second pad on the first substrate is 1 micron to 1000 microns from a vertical projection of an edge of the protruded part of the second pad on the first substrate.

2. The display panel of claim 1, wherein the first array substrate further comprises:
 a second active element disposed on the top surface of the first substrate and disposed separately from the first active element and electrically connected to the second display element and the second pad.

3. The display panel of claim 2, further comprising a circuit layer electrically connected to the first array substrate via an anisotropic conductive layer, the first pad and the second pad, wherein the anisotropic conductive layer is between the first array substrate and the circuit layer.

4. The display panel of claim 3, wherein the first array substrate further comprises a signal line disposed on the top surface of the first substrate and electrically connected between the first active element and the first pad, and the circuit layer comprises a gate driving circuit.

5. The display panel of claim 1, further comprising:
 a first anisotropic conductive layer disposed on the bottom surface of the first substrate;
 a second array substrate, comprising:
  a second substrate; and
  a second active element disposed on the second substrate, wherein the first anisotropic conductive layer is between the first array substrate and the second array substrate, and the second active element is electrically connected to the second display element of the first array substrate via the first anisotropic conductive layer and the second pad; and a plurality of third pads disposed on a bottom surface of the second substrate, wherein each of the third pads comprises a embedded part and a protruded part, the embedded part of the third pad is located in the second substrate, and the protruded part of the third pad is protruded from the bottom surface of the second substrate.

6. The display panel of claim 5, further comprising a circuit layer electrically connected to the second array substrate via a second anisotropic conductive layer and the third pads, wherein the second anisotropic conductive layer is between the second array substrate and the circuit layer.

7. The display panel of claim 6, wherein the second array substrate further comprises a signal line disposed on a top surface of the second substrate and electrically connected between the second active element and one of the third pads, and the circuit layer comprises a gate driving circuit.

8. The display panel of claim 5, further comprising an electronic element electrically connected to the second array substrate via a second anisotropic conductive layer and the third pads, wherein the second anisotropic conductive layer is between the second array substrate and the electronic element.

9. The display panel of claim 1, further comprising an electronic element electrically connected to the first array substrate via an anisotropic conductive layer, the first pad and the second pad, wherein the anisotropic conductive layer is between the first array substrate and the electronic element.

10. The display panel of claim 1, wherein the embedded part and the protruded part belong to a same film layer.

11. The display panel of claim 1, wherein a protruding height of the protruded part is substantially equal to a thickness of the embedded part.

12. The display panel of claim 1, wherein the first array substrate further comprises:

a connecting structure located in the first substrate and electrically connected to the first pad and the first active element.

* * * * *